(12) United States Patent
Jang et al.

(10) Patent No.: US 11,910,143 B2
(45) Date of Patent: Feb. 20, 2024

(54) DISPLAY PANEL AND DISPLAY APPARATUS INCLUDING THE SAME

(71) Applicant: LG Display Co., Ltd., Seoul (KR)

(72) Inventors: YongGyoon Jang, Paju-si (KR); Yong-Su Ham, Paju-si (KR); YongWoo Lee, Paju-si (KR); Kyungyeol Ryu, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/105,198

(22) Filed: Feb. 2, 2023

(65) Prior Publication Data

US 2023/0199357 A1    Jun. 22, 2023

Related U.S. Application Data

(63) Continuation of application No. 17/370,954, filed on Jul. 8, 2021, now Pat. No. 11,601,738, which is a
(Continued)

(30) Foreign Application Priority Data

Mar. 29, 2019    (KR) .......................... 10-2019-0037502

(51) Int. Cl.
*H10N 30/20*    (2023.01)
*H10N 30/00*    (2023.01)
(Continued)

(52) U.S. Cl.
CPC .............. *H04R 1/028* (2013.01); *G06F 3/016* (2013.01); *G08B 6/00* (2013.01); *H01L 25/167* (2013.01);
(Continued)

(58) Field of Classification Search
CPC ................ H04R 1/028; H04R 2400/03; H04R 2499/15; H10N 30/20; H10N 30/1051;
(Continued)

(56) References Cited

U.S. PATENT DOCUMENTS 5,457,353 A    10/1995    Thurn et al.
5,684,884 A    11/1997    Nakaya et al.
(Continued)

FOREIGN PATENT DOCUMENTS

CN    1755449 A    4/2006
CN    201118976 Y    9/2008
(Continued)

OTHER PUBLICATIONS

Office Action dated Dec. 2, 2020, issued in corresponding Chinese Patent Application No. 201910542721.8.
(Continued)

*Primary Examiner* — David L Ton
(74) *Attorney, Agent, or Firm* — Morgan, Lewis & Bockius LLP

(57) ABSTRACT

Display panel and display apparatus including the same. A display panel includes a first substrate including a display portion configured to display an image, a second substrate attached to the first substrate by an adhesive member, and a vibration generating module within the adhesive member to overlap the display portion. The vibration generating module is surrounded by the second substrate and the adhesive member.

37 Claims, 9 Drawing Sheets

Related U.S. Application Data continuation of application No. 16/450,182, filed on Jun. 24, 2019, now Pat. No. 11,095,963.

(51) Int. Cl.
  *H10K 50/842* (2023.01)
  *G06F 3/01* (2006.01)
  *G08B 6/00* (2006.01)
  *H01L 25/16* (2023.01)
  *H04R 1/02* (2006.01)

(52) U.S. Cl.
  CPC ..... *H10K 50/8426* (2023.02); *H10N 30/1051* (2023.02); *H10N 30/20* (2023.02); *H04R 2400/03* (2013.01); *H04R 2499/15* (2013.01)

(58) Field of Classification Search
  CPC ...... H10K 50/8426; G06F 3/016; G08B 6/00; H01L 26/167
  See application file for complete search history.

(56) References Cited

U.S. PATENT DOCUMENTS

| | | | |
|---|---|---|---|
| 6,629,341 | B2 | 10/2003 | Wilkie et al. |
| 7,197,798 | B2 | 4/2007 | Wilkie et al. |
| 8,712,079 | B2 | 4/2014 | Kim et al. |
| 8,873,776 | B2 | 10/2014 | Kim et al. |
| 11,095,963 | B2 | 8/2021 | Jang et al. |
| 2003/0056351 | A1 | 3/2003 | Wilkie et al. |
| 2006/0078138 | A1 | 4/2006 | Wada |
| 2012/0148073 | A1 | 6/2012 | Kim et al. |
| 2012/0274178 | A1 | 11/2012 | Ochi et al. |
| 2015/0078604 | A1 | 3/2015 | Seo et al. |
| 2015/0146892 | A1 | 5/2015 | Watanabe |
| 2015/0185963 | A1 | 7/2015 | Lee et al. |
| 2016/0008852 | A1 | 1/2016 | Miyoshi |
| 2016/0014526 | A1 | 1/2016 | Miyoshi et al. |
| 2016/0170539 | A1 | 6/2016 | Watanabe et al. |
| 2017/0161868 | A1 | 6/2017 | Kim et al. |
| 2018/0083183 | A1 | 3/2018 | Bella et al. |
| 2018/0164888 | A1 | 6/2018 | Ham et al. |
| 2019/0037164 | A1 | 1/2019 | Kim et al. |
| 2019/0045286 | A1 | 2/2019 | Kim et al. |
| 2019/0182572 | A1 | 6/2019 | Kim |
| 2019/0208299 | A1 | 7/2019 | Kim et al. |

FOREIGN PATENT DOCUMENTS

| | | |
|---|---|---|
| CN | 102725873 A | 10/2012 |
| CN | 106293280 A | 1/2017 |
| CN | 108124224 A | 6/2018 |
| CN | 109326236 A | 2/2019 |
| EP | 3264167 A1 | 1/2018 |
| EP | 3 331 251 A1 | 6/2018 |
| JP | H07-327297 A | 12/1995 |
| JP | 2008-294493 A | 12/2008 |
| JP | 5820846 B2 | 11/2015 |
| KR | 10-2010-0073075 A | 7/2010 |
| KR | 10-2016-0015348 A | 2/2016 |
| KR | 10-2017-0115003 A | 10/2017 |
| KR | 10-2017-0133541 A | 12/2017 |
| KR | 10-2017-0134524 A | 12/2017 |
| KR | 10-2018-0003372 A | 1/2018 |
| WO | 2014/162976 A1 | 10/2014 |

OTHER PUBLICATIONS

Office Action dated Mar. 18, 2020, issued in corresponding German Patent Application No. 10 2019 119 181.5.
Combined Search and Examination Report dated Jan. 16, 2020, issued in corresponding British Patent Application No. 1910207.8.
Office Action dated Jul. 8, 2023, issued in corresponding Chinese Divisional Patent Application No. 202110894756.5.
Office Action dated Dec. 2, 2023 for corresponding Korean Patent Application No. 10-2019-0037502.

DISPLAY PANEL AND DISPLAY APPARATUS INCLUDING THE SAME

CROSS-REFERENCE TO RELATED APPLICATIONS

This application is a continuation of co-pending U.S. patent application Ser. No. 17/370,954, filed on Jul. 8, 2021, which is a continuation of U.S. patent application Ser. No. 16/450,182, filed on Jun. 24, 2019, now U.S. Pat. No. 11,095,963, which claims the benefit of the Korean Patent Application No. 10-2019-0037502 filed on Mar. 29, 2019. Each of the above prior U.S. and Korean patent applications is hereby incorporated by reference as if fully set forth herein.

BACKGROUND

Technical Field

The present disclosure relates to a display apparatus, and more particularly, to a display panel for outputting a sound and a display apparatus including the same.

Discussion of the Related Art

In display apparatuses, a display panel displays an image, and a separate speaker may generally be installed for providing a sound. When a speaker is disposed in a display apparatus, the speaker occupies space in the display apparatus, which may limit the design and spatial disposition of the display apparatus.

A speaker applied to display apparatuses may be, for example, an actuator including a magnet and a coil. However, when the actuator is applied to a display apparatus, the display apparatus may be relatively thick.

SUMMARY

Accordingly, the present disclosure is directed to providing a display panel and a display apparatus including the same that substantially obviate one or more problems due to limitations and disadvantages of the related art.

The inventors have recognized problems of general display apparatuses, and thus, have performed various experiments which attach a vibration generating module, such as an actuator, on an outer portion of a display panel to output a sound on the basis of vibrating the display panel. Also, the inventors have recognized a problem where the vibration generating module may be damaged in a process of attaching the vibration generating module on the display panel after manufacturing of the display panel is completed, which may reduce the process yield rate and complicate the attachment process. The inventors have performed various experiments for simplifying the process by integrating the display panel and the vibration generating module, and preventing the vibration generating module from being damaged in the process. Through various experiments, the inventors have developed a new display panel including a vibration generating module, and a new display apparatus which outputs a sound to a forward region in front of the display panel on the basis of vibration of the vibration generating module embedded into the display panel.

An aspect of the present disclosure is to provide a display panel including a vibration generating module and a display apparatus including the same.

Another aspect of the present disclosure is to provide a display panel having a new structure, which is improved in appearance design and is slimmed, and a display apparatus including the same.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, a display panel comprises a first substrate including a display portion configured to display an image; a second substrate attached to the first substrate by an adhesive member; and a vibration generating module within the adhesive member to overlap the display portion, the vibration generating module being surrounded by the second substrate and the adhesive member.

In another aspect of the present disclosure, a display panel comprises a display substrate including a pixel layer having a plurality of pixels on a first substrate; and a cover substrate configured to cover the display substrate, wherein the cover substrate includes: a second substrate on the display substrate; a vibration generating module on the second substrate; and an adhesive member attached to the pixel layer to cover the vibration generating module.

A display panel and a display apparatus including the same according to the present disclosure may vibrate based on driving of a vibration generating module integrated or embedded into a cover substrate to output a sound or to generate a haptic feedback responding to a touch.

Moreover, the display panel and the display apparatus including the same according to the present disclosure, the vibration generating module and an adhesive member may be integrated as one element on the cover substrate, and thus, a process may be simplified and the vibration generating module may be prevented from being damaged in a process.

Moreover, the display panel and the display apparatus including the same according to the present disclosure, the vibration generating module may be inserted into the adhesive member, and thus, an appearance design may be improved and a product may be slimmed.

Moreover, the display panel and the display apparatus including the same according to the present disclosure, the vibration generating module may be implemented as a thin film type having a piezoelectric characteristic and flexibility and may be embedded thereinto, and thus, the display panel may be wound in a spiral form or unwound or may be bent at a certain curvature radius.

In addition to the above-described effects, other features and advantages of the present disclosure will be described below, but will be clearly understood by those skilled in the art from descriptions below.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
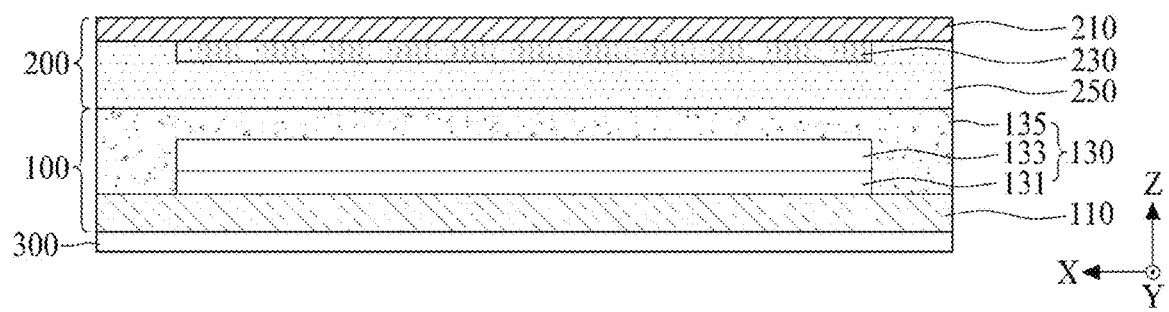
FIG. 1 illustrates a cross-sectional view of a display panel according to a first embodiment of the present disclosure.

Reference will now be made in detail to the exemplary embodiments of the present disclosure, examples of which are illustrated in the accompanying drawings. Wherever possible, the same reference numbers may be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted. In a case where "comprise," "have," and "include" described in the present specification are used, another part may be added unless "only" is used. The terms of a singular form may include plural forms unless referred to the contrary.

In construing an element, the element is construed as including an error range although there is no explicit description.

In describing a position relationship, for example, when a position relation between two parts is described as "on~," "over~," "under~," and "next~," one or more other parts may be disposed between the two parts unless "just" or "direct" is used.

In describing a time relationship, for example, when temporal order is described as "after~," "subsequent~," "next~," and "before~," a case which is not continuous may be included unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled or connected to or combined with each other, and may be variously interoperated with each other and driven technically as those skilled in the art can sufficiently understand. The embodiments of the present disclosure may be carried out independently from each other, or may be carried out together in co-dependent relationship.

Hereinafter, embodiments of a display panel and a display apparatus including the same according to the present disclosure will be described in detail with reference to the accompanying drawings. In adding reference numerals to elements of each of the drawings, although the same elements are illustrated in other drawings, like reference numerals may refer to like elements. Also, for convenience of description, a scale of each of elements illustrated in the accompanying drawings differs from a real scale, and thus, is not limited to a scale illustrated in the drawings.

A display panel according to example embodiments of the present disclosure may be a light self-emitting display panel, a light self-emitting flexible display panel, or a curved light self-emitting display panel such as an organic light emitting display panel, a quantum dot light emitting display panel, a micro light emitting diode display panel, or any other type of display panel that outputs light. For example, the display panel according to example embodiments of the present disclosure may vibrate by a vibration generating module to generate a sound wave (e.g., a sound) or to generate a haptic feedback responding to a touch, but embodiments are not limited to a specific display panel.

FIG. 1 illustrates a cross-sectional view of a display panel according to a first embodiment of the present disclosure.

With reference to FIG. 1, the display panel 10 according to the first embodiment of the present disclosure may include a display substrate 100 and a cover substrate 200.

The display substrate 100 may be defined as a pixel array substrate or a thin film transistor (TFT) array substrate each including a display portion which displays an image (e.g., by emitting light), but is not limited thereto.

The display substrate 100 according to an embodiment may include a first substrate 110 and a pixel array layer 130.

The first substrate 110 may be a base substrate of the display substrate 100 and may include a plastic material or a glass material. For example, the first substrate 110 may be formed of a flexible material capable of being curved or bent, and for example, may include opaque or colored polyimide (PI). As another example, the first substrate 110 may be formed of a thin glass material having flexibility.

The first substrate 110 may include a display portion defined on a first surface and a non-display portion surrounding the display portion.

The pixel array layer 130 may include a plurality of pixels which are provided in the display portion defined on the first surface and display an image. Each of the plurality of pixels may be a minimum-unit area which actually emits light, and may be defined as a subpixel. At least three adjacent pixels may configure one unit pixel for displaying color. For example, one unit pixel may include a red pixel, a green pixel, and a blue pixel which are adjacent to one another, and may further include a white pixel for enhancing luminance.

The pixel array layer 130 according to an embodiment may include a pixel circuit layer 131, a light emitting device layer 133, and an encapsulation layer 135.

The pixel circuit layer 131 may include a plurality of signal lines disposed on the first substrate 110, and a pixel circuit disposed in each of a plurality of pixel areas defined by the signal lines. The signal lines may include a gate line, a data line, and a pixel driving power line. The pixel circuit may include a plurality of TFTs connected to the signal lines and at least one capacitor.

The light emitting device layer 133 may be disposed in each pixel area on the first substrate 110 and may be electrically connected to a corresponding pixel circuit.

The light emitting device layer 133 according to an embodiment may include an anode electrode electrically connected to a corresponding pixel circuit, a light emitting device provided on the anode electrode, and a cathode electrode electrically connected to the light emitting device.

The anode electrode may be disposed in a pattern shape in an emission area defined in each pixel area and may be electrically connected to the pixel circuit.

The light emitting device according to an embodiment may include a light emitting layer provided on the anode electrode. The light emitting layer may be implemented to emit light of the same color (for example, white light) for each pixel, or may be implemented to emit lights of different colors (for example, red light, green light, or blue light) for each pixel. For example, the light emitting layer may be formed of only an organic light emitting layer, or may be provided in a stacked structure of an organic light emitting layer and a quantum dot light emitting layer.

A light emitting device according to another embodiment may include a micro light emitting diode device electrically connected to each of an anode electrode and a cathode electrode. The micro light emitting diode device may be a light emitting diode implemented as an integrated circuit (IC) or a chip type, and may include a first terminal electrically connected to the anode electrode and a second terminal electrically connected to the cathode electrode.

The cathode electrode may be commonly connected to the light emitting devices of the light emitting device layer 133 provided in each pixel area.

The light emitting device layer 133 according to an embodiment may have a bottom emission structure where light emitted from the light emitting device passes through the first substrate 110 and is output to the outside, a top emission structure where the light emitted from the light emitting device passes through the cover substrate 200 and is output to the outside, and a dual emission structure where the light emitted from the light emitting device passes through both of the first substrate 110 and the cover substrate 200. In this case, the anode electrode may be referred to as a first electrode or a pixel electrode, but the term is not limited thereto. Also, the cathode electrode may be referred to as a second electrode or a common electrode, but the term is not limited thereto.

The encapsulation layer 135 may be disposed on the first substrate 110 and may prevent or block oxygen or water from penetrating into the light emitting device layer 133. The encapsulation layer 135 may be referred to as a device protection layer, but is not limited thereto.

The encapsulation layer 135 may be provided on the pixel circuit layer 131 or the first substrate 110 to surround the light emitting device layer 133. The encapsulation layer 135 according to an embodiment may be provided in a multi-layer structure where an organic material layer and an inorganic material layer are alternately stacked. The inorganic material layer may prevent or block oxygen or water from penetrating into the light emitting device layer 133. The organic material layer may be provided to have a thickness which is relatively thicker than that of the inorganic material layer, so as to sufficiently cover particles occurring in a manufacturing process. For example, the encapsulation layer 135 may include a first inorganic material layer surrounding the light emitting device layer 133, an organic material layer surrounding the first inorganic material layer, and a second inorganic material layer surrounding the organic material layer. Each of the first and second inorganic material layers may include a material such as silicon nitride (SiNx), silicon oxide (SiOx), silicon oxynitride (SiON), or aluminum oxide (AlxOy), but is not limited thereto. The organic material layer may include acryl resin, epoxy resin, phenolic resin, polyamide resin, polyimide resin, benzocyclobutene resin, and fluoride resin, but is not limited thereto.

The cover substrate 200 may be attached (e.g., coupled or connected) to the display substrate 100 by an adhesive member 250 to protect the display substrate 100, and may vibrate the display panel 10 to output a sound to a forward region in front of the display panel 10 or provide a haptic feedback to a display surface of the display panel 10. The cover substrate 200 may be referred to as an opposite substrate or an encapsulation substrate, but is not limited thereto.

The cover substrate 200 according to an embodiment may include a second substrate 210, a vibration generating module 230, and the adhesive member 250.

The second substrate 210 may include a metal material, a plastic material, or a glass material. For example, when the light emitting device layer 133 has the bottom emission structure, the second substrate 210 may be formed of a metal material, and when the light emitting device layer 133 has the top emission structure or the dual emission structure, the second substrate 210 may be formed of a transparent plastic material or a glass material. The second substrate 210 may protect the pixel array layer 130 disposed on the display substrate 100 from an external impact, and may primarily prevent or block oxygen or water from penetrating into the pixel array layer 130.

The second substrate 210 including a metal material according to an embodiment may include one material of stainless steel, aluminum (Al), a magnesium (Mg) alloy, a magnesium-lithium (Mg—Li) alloy, and aluminum (Al) alloy, but is not limited thereto.

The second substrate 210 including a glass material according to an embodiment may include tempered glass, and for example, may include one of sapphire glass and gorilla glass or a stacked structure thereof, but is not limited thereto.

The second substrate 210 including a plastic material according to an embodiment may include one material of polyethyleneterephthalate (PET), polycarbonate (PC), polyethersulfone (PES), polyethylenapthanate (PEN), and polynorborneen (PNB), but is not limited thereto.

The vibration generating module 230 may be disposed on the second substrate 210 and may vibrate based on an electrical signal supplied from the outside to vibrate the display panel 10. The vibration generating module 230 may be referred to as a sound generating module, a sound generating device, a film actuator, a film type piezoelectric composite actuator, a film speaker, a film type piezoelectric speaker, or a film type piezoelectric composite speaker, which each uses the display panel 100 as a vibration plate, but the term is not limited thereto.

The vibration generating module 230 according to an embodiment may include a piezoelectric material which vibrates based on a piezoelectric effect (or a piezoelectric characteristic) caused by an electric field generated by an electrical signal. For example, the vibration generating module 230 may include a piezoelectric polymer, piezoelectric ceramic, or a polymer/ceramic composite, but is not limited thereto. For example, when the display substrate 100 has the bottom emission structure, the vibration generating module 230 may be formed of an opaque piezoelectric material or a transparent piezoelectric material. As another example, when the display substrate 100 has the top emission structure or the dual emission structure, the vibration generating module 230 may be formed of a transparent piezoelectric material.

The vibration generating module 230 according to an embodiment may have a size corresponding to the pixel array layer 130 (or the display portion) disposed on the display substrate 100. A size of the vibration generating module 230 may be 0.9 to 1.1 times a size of the display portion, but is not limited thereto. For example, a size of the vibration generating module 230 may be the same as or approximately equal to that of the display portion, and thus, the vibration generating module 230 may cover most region of the display portion. Also, a vibration generated by the vibration generating module 230 may vibrate a whole portion or entire portion of the display panel 10, and thus, localization of a sound may be high and satisfaction of a user may be improved. Also, a contact area (or panel coverage) between the display panel 10 and the vibration generating module 230 may increase, and thus, a vibration region of the display panel 10 may increase, thereby improving a sound of a middle-low-pitched sound band generated based on a vibration of the display panel 10. Also, in a large-sized display apparatus, a whole portion or entire portion of the display panel 10 having a large size (or a large area) may vibrate, and thus, localization of a sound based on a vibration of the display panel 10 may be more enhanced, thereby realizing a stereo sound effect.

The vibration generating module 230 according to an embodiment may be integrated (or provided) as one body with the adhesive member 250 and may be surrounded by the second substrate 210 and the adhesive member 250. For example, the vibration generating module 230 may be inserted into the adhesive member 250, and thus, may be disposed closer to the second substrate 210 than the first substrate 110.

The vibration generating module 230 according to an embodiment may include at least three surfaces, and at least two surfaces thereof may be surrounded by the adhesive member 250. For example, the vibration generating module 230 may have a three-surface structure or a five or a multi-surface structure include five or more surfaces, which each includes a first surface directly contacting the second substrate 210, a second surface opposite to the first surface, and at least one side surface between the first surface and the second surface. For example, the vibration generating module 230 may have a three-surface structure having a circular plate shape, and in this case, the second surface and a circular side surface of the vibration generating module 230 may be surrounded by the adhesive member 250. As another example, the vibration generating module 230 may have a five-surface structure having a triangular plate shape, and in this case, the second surface and side surfaces of the vibration generating module 230 may be surrounded by the adhesive member 250. As another example, the vibration generating module 230 may have an N+2-surface (where N is a natural number equal to or more than four) structure having an N-angular plate shape, and in this case, the second surface and the side surfaces of the vibration generating module 230 may be surrounded by the adhesive member 250.

The adhesive member 250 may be attached (e.g., coupled or connected) to the pixel array layer 130 of the display substrate 100 and may cover the vibration generating module 230. The adhesive member 250 may be attached on the display substrate 100 through a substrate bonding process. The adhesive member 250 according to an embodiment may be a pressure sensitive adhesive (PSA), an optical clear adhesive (OCA), or the like. For example, the adhesive member 250 may include an adhesive material such as epoxy, acryl, silicon, or urethane. The adhesive material 250 according to an embodiment may further include a getter material for adsorbing water and/or oxygen, thereby enhancing the reliability of the light emitting device.

The adhesive member 250 and the vibration generating module 230 may be integrated (or provided) as one body on the first surface of the second substrate 210, and thus, the adhesive member 250 may protect the vibration generating module 230. For example, the adhesive member 250 may cover the vibration generating module 230, and thus, may prevent or reduce the vibration generating module 230 from being damaged by an external impact, and may prevent or minimize the reduction in vibration performance (or sound performance) caused by the damage.

The adhesive member 250 may be disposed on the second substrate 210 and may support the vibration generating module 230. In this case, the vibration generating module 230 may be disposed on the adhesive member 250 and may be externally exposed. Due to this, the vibration generating module 230 may be damaged while the cover substrate 200 is being transferred for a substrate bonding process performed on the display substrate 100, and the cover substrate 200, the vibration generating module 230 may be damaged in the substrate bonding process, partial detachment between the display substrate 100 and the cover substrate 200 may occur due to an insufficient contact area between the adhesive member 250 and the pixel array layer 130, and the reliability of the light emitting device may be reduced due to penetration of water and/or oxygen through an interface between the vibration generating module 230 and the display substrate 100. In order to prevent or reduce such problems, the adhesive member 250 may be formed to cover the vibration generating module 230.

The cover substrate 200 may be a single structure or a single structure body, where the second substrate 210, the vibration generating module 230, and the adhesive member 250 are modularized as one element. The cover substrate 200 according to an embodiment may be manufactured through a process of placing (or attaching) the vibration generating module 230 on the second substrate 210 and a process of forming (or coating) the adhesive member 250 on the second substrate 210 to cover the vibration generating module 230. Therefore, the cover substrate 200 may include the vibration generating module 230 and the adhesive member 250 each provided as one body on the second substrate 210, and may vibrate based on a vibration of the vibration generating module 230. The adhesive member 250 may be completely cured through the substrate bonding process performed on the display substrate 100 and the cover substrate 200, and may maintain a non-curing state (or a virtual curing state) which is not cured before the substrate bonding process.

The display panel 10 according to the first embodiment of the present disclosure may further include a functional film 300.

The functional film 300 may be disposed on a front surface of the display substrate 100, and in this case, the display panel 10 may have the bottom emission structure or the dual emission structure. For example, the functional film 300 may be attached on a second surface opposite to a first surface of the first substrate 110. The functional film 300 according to an embodiment may be attached on a front surface of the display substrate 100 by a film adhesive member. For example, the film adhesive member may include a pressure sensitive adhesive (PSA), an optical clear adhesive (OCA), or an optical clear resin (OCR).

The functional film 300 according to an embodiment may include an anti-reflection layer (or an anti-reflection film) for preventing reflection of external light to enhance outdoor visibility and a contrast ratio with respect to an image displayed by the display panel 10. For example, the anti-reflection layer may include a circular polarization layer (or a circular polarization film) which prevents or reduces reflected light from traveling to the first substrate 110 when external light is incident thereon through the first substrate 110 and is reflected by TFTs and/or lines disposed on the pixel array layer 130.

The functional film 300 according to an embodiment may further include a barrier layer (or a barrier film) for primarily preventing penetration of water or oxygen, and the barrier layer may include a material (for a polymer material) which is low in water vapor transmission rate.

Moreover, the functional film 300 may further include a light path control layer (or a light path control film) for controlling a path of light output from the pixel array layer 130 to the first substrate 110. The light path control layer may include a stacked structure where a high refraction layer and a low refraction layer are alternately stacked and may change a path of light incident from the pixel array layer 130 to minimize a color shift based on a viewing angle.

As another embodiment, when the display panel 10 has the top emission structure or the dual emission structure, the functional film 300 may be disposed on a front surface (for example, a second surface of the second substrate 210) of the cover substrate 200 by a film adhesive member.

The display panel 10 according to the first embodiment of the present disclosure may further include a touch panel.

The touch panel according to an embodiment may be disposed to overlap the pixel array layer 130 and may act as a touch sensor for sensing a user touch applied to the display panel 10. For example, the touch panel may be disposed between the display substrate 100 and the functional film 300, or may be disposed between the display substrate 100 and the cover substrate 200. The touch panel may include a touch sensor layer overlapping the pixel array layer 130. The touch panel may include a plurality of touch electrodes for sensing a variation of a capacitance caused by the user touch based on a mutual capacitive type or a self-capacitive type.

Therefore, the display panel 10 according to the first embodiment of the present disclosure may vibrate based on driving of the vibration generating module 230 integrated or embedded thereinto, to output a sound to a forward region in front of the display panel 10 or to generate a haptic feedback responding to a touch. Also, in the display panel 10 according to the first embodiment of the present disclosure, the vibration generating module 230 and the adhesive member 250 may be integrated as one element on the cover substrate 200, and thus, a process may be simplified and the vibration generating module may be prevented or reduced from being damaged in a process. Also, in the display panel 10 according to the first embodiment of the present disclosure, the vibration generating module 230 may be inserted into the adhesive member 250, and thus, the design appearance may be improved and the product may be slimmed.

Moreover, the display panel 10 according to the first embodiment of the present disclosure may be applied to a flexible display apparatus, and for example, may be applied to a curved display apparatus bent at a certain curvature radius, but is not limited thereto, and may be applied to a rollable display apparatus wound in a spiral form, a bendable display apparatus, a wearable display apparatus wound around a wrist, or a commercial display apparatus having a plurality of curved portions. The bendable display apparatus may be an edge bending display apparatus, a bezel bending display apparatus, or an active bending display apparatus, but is not limited thereto. In this case, the vibration generating module 230 may be implemented to be bent based on a certain curvature radius or to be bent based on winding in a spiral shape or unwinding, and may be embedded into the display panel 10, or may be embedded into the display panel 10 to be disposed at a predetermined distance in the display panel 10 relative to other vibration generating modules 230.

Figure 2:
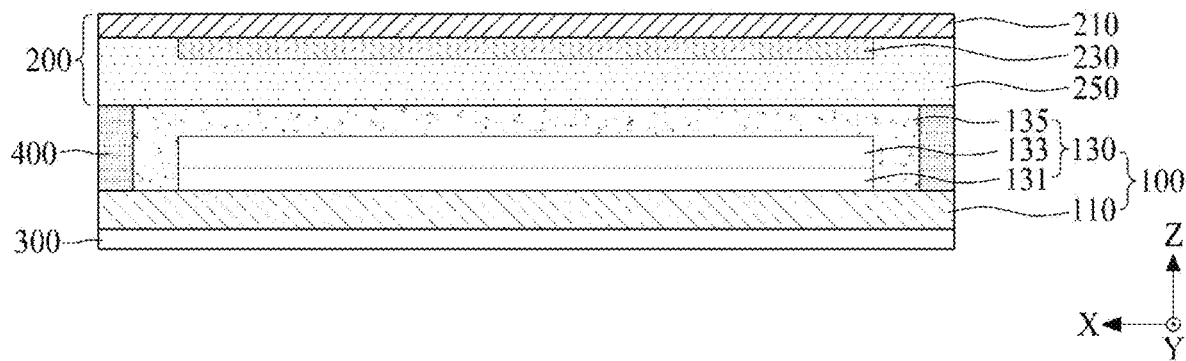
FIG. 2 illustrates a cross-sectional view of a display panel according to a second embodiment of the present disclosure.

FIG. 2 illustrates a cross-sectional view of a display panel 20 according to a second embodiment of the present disclosure, and illustrates an embodiment where a sealing member is added to the display panel illustrated in FIG. 1. Hereinafter, therefore, only the sealing member will be described in detail, where like reference numerals refer to like elements as in the other elements of FIG. 1, and repetitive descriptions are omitted or will be briefly given.

With reference to FIG. 2, in the display panel 20 according to the second embodiment of the present disclosure, a sealing member 400 may be disposed between an edge or a periphery of a display substrate 100 and an edge or a periphery of a cover substrate 200, and may attach the display substrate 100 on the cover substrate 200. Also, the sealing member 400 may surround an outer portion of a pixel array layer 130 disposed on the display substrate 100, and may prevent or block penetration of water or oxygen through side surfaces.

The sealing member 400 according to an embodiment may be formed of a high-viscosity resin (for example, an epoxy material) which is cured by light, such as ultraviolet (UV). Furthermore, the sealing member 400 may be formed of an epoxy material including a getter material capable of adsorbing water and/or oxygen, but is not limited thereto. The sealing member 400 may prevent or block penetration of water and/or oxygen through the side surfaces to protect a light emitting device from water and/or oxygen, thereby preventing a lifetime of the light emitting device from being shortened by water and/or oxygen and enhancing the reliability of the light emitting device.

The sealing member 400 according to an embodiment may be disposed between an edge or a periphery of a first substrate 110 and an edge or a periphery of an adhesive member 250.

According to another embodiment, the sealing member 400 may be disposed between the edge or a periphery of the first substrate 110 and an edge or a periphery of a second substrate 210. In this case, the display panel 10 according to the present embodiment may further include a filler disposed between the pixel array layer 130 of the display substrate 100 and the adhesive member 250 of the cover substrate 200.

The filler may include a material which is filled between the pixel array layer 130 and the adhesive member 250, and for example, may include a transparent epoxy material which transmits light, but is not limited thereto. In this case, the sealing member 400 may limit the spread of the filler or may prevent or reduce the overflow of the filler.

Therefore, the display panel 20 according to the second embodiment of the present disclosure may have the same effect as that of the display panel 10 illustrated in FIG. 1, and the sealing member 400 may prevent or block penetration of water and/or oxygen through the side surfaces, thereby preventing a lifetime of the light emitting device from being shortened by water and/or oxygen and enhancing the reliability of the light emitting device.

Figure 3:
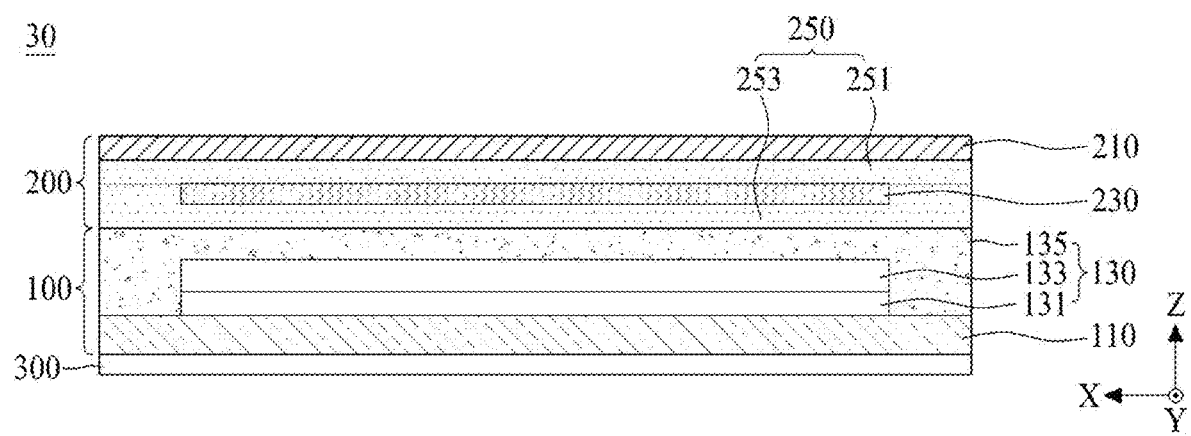
FIG. 3 illustrates a cross-sectional view of a display panel according to a third embodiment of the present disclosure.

FIG. 3 illustrates a cross-sectional view of a display panel 30 according to a third embodiment of the present disclosure, and illustrates an embodiment implemented by modifying a structure of a cover substrate in the display panel illustrated in FIG. 1. Hereinafter, therefore, only a cover substrate will be described in detail, like reference numerals refer to like elements as in the other elements of FIG. 1, and repetitive descriptions are omitted or will be briefly given.

With reference to FIG. 3, in the display panel 30 according to the third embodiment of the present disclosure, a cover substrate 200 may include a second substrate 210, a vibration generating module 230, and an adhesive member 250. Except for that the adhesive member 250 is provided to surround an entire surface (or all surfaces) of the vibration generating module 230, the cover substrate 200 may be the same as FIG. 1, and thus, only different elements will be described below.

The adhesive member 250 according to the present embodiment may be provided on the second substrate 210 to support the vibration generating module 230 and may be attached (e.g., coupled or connected) to a pixel array layer 130 of a display substrate 100. The adhesive member 250 may separate the vibration generating module 230 from the second substrate 210 by a predetermined distance, and may absorb or reduce an external impact transferred to the vibration generating module 230 through the second substrate 210, thereby preventing the vibration generating module 230 from being damaged by an external impact and preventing or minimizing the reduction in vibration performance (or sound performance) caused by the damage.

The adhesive member 250 according to an embodiment may include a first adhesive layer 251 and a second adhesive layer 253.

The first adhesive layer 251 may be disposed between a first surface of the second substrate 210 and a first surface of the vibration generating module 230. The first adhesive layer 251 according to an embodiment may be directly provided (or coated) on the first surface of the second substrate 210 to support the vibration generating module 230 and may separate the vibration generating module 230 from the second substrate 210.

The first adhesive layer 251 may act as a vibration transfer layer which transfers a vibration of the vibration generating module 230 to the second substrate 210. For example, a thickness of the first adhesive layer 251 may be 0.9 or 1.1 times a thickness of the vibration generating module 230, but is not limited thereto. When a thickness of the first adhesive layer 251 is equal to or greater than half of a total thickness of the adhesive member 250, a vibration transferred to the second substrate 210 based on a vibration of the vibration generating module 230 may be reduced. Therefore, a thickness of the first adhesive layer 251 may be adjusted to a thickness which is 0.9 to 1.1 times a thickness of the vibration generating module 230, for preventing the vibration generating module 230 from being damaged by an external impact and minimizing the loss of a vibration transferred to the second substrate 210 based on a vibration of the vibration generating module 230.

The second adhesive layer 253 may be provided (or coated) on the first adhesive layer 251 to cover a whole portion or entire portion of the vibration generating module 230 disposed on the first adhesive layer 251. The first surface of the vibration generating module 230 may be covered by the first adhesive layer 251, and a second surface and side surfaces of the vibration generating module 230 may be covered by the second adhesive layer 253. Accordingly, the vibration generating module 230 may be fully covered or surrounded by the first adhesive layer 251 and the second adhesive layer 253.

The first adhesive layer 251 and the second adhesive layer 253 according to an embodiment may be formed of the same material. The first adhesive layer 251 and the second adhesive layer 253 may each include an adhesive material such as epoxy, acryl, silicon, or urethane. For example, the first adhesive layer 251 and the second adhesive layer 253 may each include an acryl-based adhesive material having a hard characteristic.

According to another embodiment, the first adhesive layer 251 and the second adhesive layer 253 may be formed of different materials, such as materials among epoxy, acryl, silicon, or urethane. For example, the first adhesive layer 251 which acts as a vibration transfer layer may have a hard characteristic which is relatively higher than that of the second adhesive layer 253. For example, the first adhesive layer 251 may include an acryl-based adhesive material having a hard characteristic. The second adhesive layer 253 may include a urethane-based adhesive material relatively having a ductile characteristic in comparison with an acryl-based adhesive material.

The cover substrate 200 according to the present embodiment may be manufactured through a process of forming (or coating) the first adhesive layer 251 by a predetermined thickness on the second substrate 210, a process of placing (or attaching) the vibration generating module 230 on the first adhesive layer 251, and a process of forming (or coating) the second adhesive layer 253 on the first adhesive layer 251 to cover the vibration generating module 230. The first adhesive layer 251 may be in a completely cured state or a non-cured state (or a virtually cured state). Also, the second adhesive layer 253 may be completely cured through a substrate bonding process performed on the display substrate 100 and may maintain a non-cured state (or a virtually cured state) which is not cured before the substrate bonding process.

Therefore, the display panel 30 according to the third embodiment of the present disclosure may have the same effect as that of the display panel 10 illustrated in FIG. 1, and the vibration generating module 230 may be fully surrounded by the adhesive member 250, thereby preventing the vibration generating module 230 from being damaged by an external impact and preventing or minimizing the reduction in vibration performance (or sound performance) caused by the damage.

Additionally, the display panel 30 according to the third embodiment of the present disclosure may further include the sealing member 400 of the display panel 20 illustrated in FIG. 2, and thus, the sealing member 400 may prevent or block penetration of water and/or oxygen through the side surfaces, thereby preventing a lifetime of the light emitting device from being shortened by water and/or oxygen and enhancing the reliability of the light emitting device.

Figure 4:
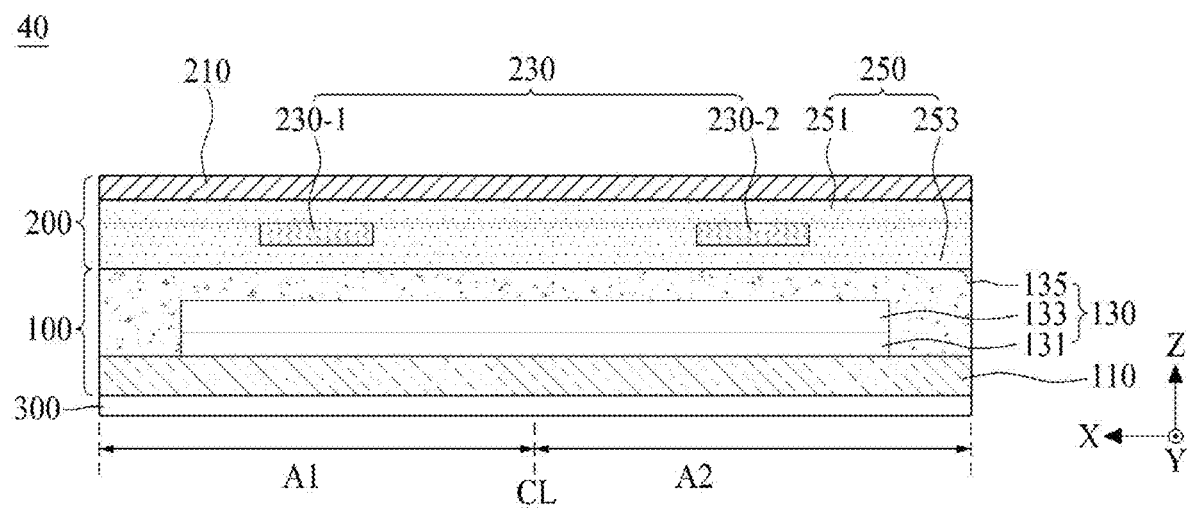
FIG. 4 illustrates a cross-sectional view of a display panel according to a fourth embodiment of the present disclosure.
Figure 5:
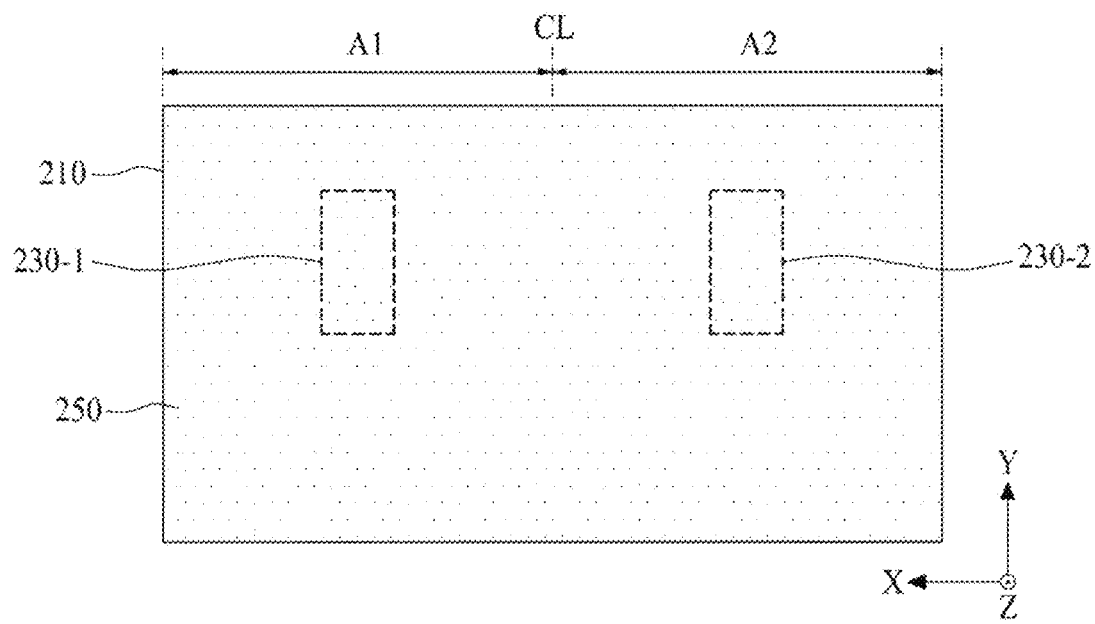
FIG. 5 illustrates a plan view of a display panel illustrated in FIG. 4, and including a vibration generating module.

FIGS. 4 and 5 respectively illustrate a cross-sectional and plan view of a display panel 40 according to a fourth embodiment of the present disclosure, and illustrate an embodiment implemented by modifying a vibration generating module in the display panel illustrated in FIG. 3. Hereinafter, therefore, only a vibration generating module will be described in detail, like reference numerals refer to like elements as in the other elements of FIG. 2, and repetitive descriptions are omitted or will be briefly given.

With reference to FIGS. 4 and 5, in the display panel 40 according to the fourth embodiment of the present disclosure, a vibration generating module 230 may include a first vibration generating module 230-1 and a second vibration generating module 230-2.

The rear surface (or a back surface) of the display panel 40 may include first and second regions A1 and A2. For example, the rear surface (or the back surface) of the display panel 40 may be divided into the first and second regions A1 and A2. For example, in the rear surface of the display panel 40, the first region A1 may be a left region, and the second region A2 may be a right region. The first and second regions A1 and A2 may be symmetrical laterally with respect to a center line CL of the display panel 40 in a first direction X.

The first vibration generating module 230-1 may be disposed in the first region A1 of the display panel 40. The first vibration generating module 230-1 according to an embodiment may be disposed on the first adhesive layer 251 overlapping the first region A1 of the display panel 40 and may be fully surrounded by the second adhesive layer 253. The first vibration generating module 230-1 may vibrate the first region A1 of the display panel 40 to generate a first panel vibration sound or a first haptic feedback in the first region A1 of the display panel 40. For example, the first panel vibration sound may be a left sound.

The first vibration generating module 230-1 may be disposed close to a center portion or an edge or a periphery of the display panel 40 in the first region A1 of the display panel 40 with respect to the first direction X. A size of the first vibration generating module 230-1 may have a size equal to or less than half of the first region A1, but is not limited thereto, and may be adjusted to be a size equal to or greater than half of the first region A1 on the basis of a sound characteristic needed based on a vibration of the display panel 40. For example, in the first region A1 of the display panel 40, as a size of the first vibration generating module 230-1 increases, a vibration region of the first region A1 may increase to enhance a low-pitched sound band characteristic of a left sound. On the other hand, in the first region A1 of the display panel 40, as a size of the first vibration generating module 230-1 decreases, the vibration region of the first region A1 may decrease to enhance a high-pitched sound band characteristic of the left sound. Accordingly, a size of the first vibration generating module 230-1 may be adjusted based on a characteristic of a sound band needed based on the vibration of the display panel 40.

The second vibration generating module 230-2 may be disposed in the second region A2 of the display panel 40. The second vibration generating module 230-2 according to an embodiment may be disposed on the first adhesive layer 251 overlapping the second region A2 of the display panel 40 and may be fully surrounded by the second adhesive layer 253. The second vibration generating module 230-2 may vibrate the second region A2 of the display panel 40 to generate a second panel vibration sound or a second haptic feedback in the second region A2 of the display panel 40. For example, the second panel vibration sound may be a right sound.

The second vibration generating module 230-2 may be disposed close to a center portion or an edge of the display panel 40 in the second region A2 of the display panel 40 with respect to the first direction X. A size of the second vibration generating module 230-2 may have a size equal to or less than half of the second region A2, but is not limited thereto, and may be adjusted to be a size equal to or greater than half of the second region A2 on the basis of a sound characteristic needed based on a vibration of the display panel 40. For example, in the second region A2 of the display panel 40, as a size of the second vibration generating module 230-2 increases, a vibration region of the second region A2 may increase to enhance a low-pitched sound band characteristic of a right sound. On the other hand, in the second region A2 of the display panel 40, as a size of the second vibration generating module 230-2 decreases, the vibration region of the second region A2 may decrease to enhance a high-pitched sound band characteristic of the right sound. Accordingly, a size of the second vibration generating module 230-2 may be adjusted based on a characteristic of a sound band needed based on the vibration of the display panel 40.

Therefore, the display panel 40 according to the fourth embodiment of the present disclosure may have the same effect as that of the display panel 30 illustrated in FIG. 3, and may output the left sound and the right sound through the first and second vibration generating modules 230-1 and 230-2 of the vibration generating module 230, thereby realizing a stereo sound.

As another embodiment, the first and second vibration generating modules 230-1 and 230-2 may be disposed to directly contact the second substrate 210 and may be covered by the adhesive member 250, and in this case, a vibration of each of the first and second vibration generating modules 230-1 and 230-2 may be directly transferred to the second substrate 210, and thus, a sound pressure characteristic of each of the left sound and the right sound may increase.

Figure 6:
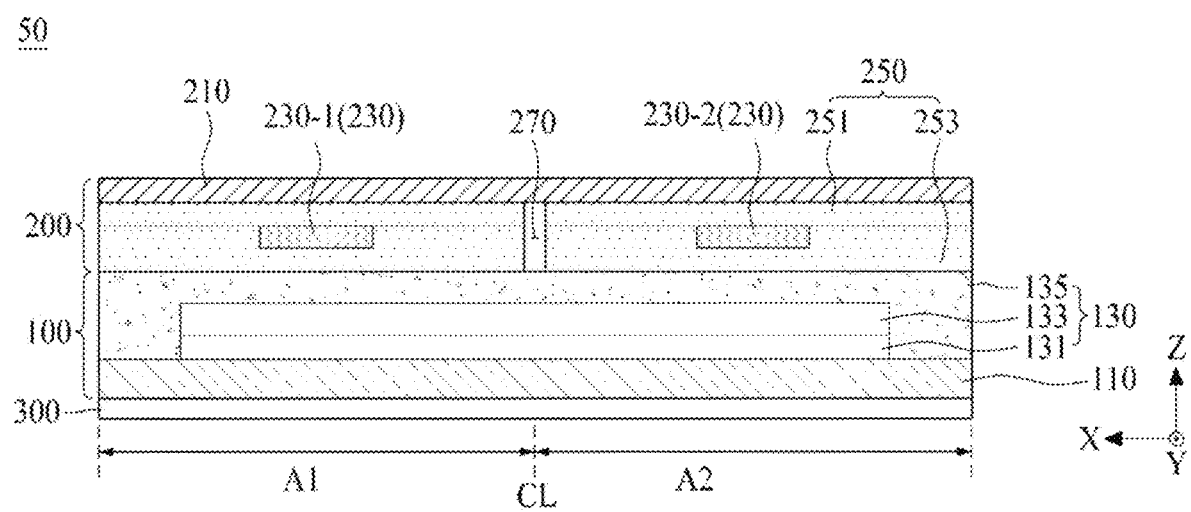
FIG. 6 illustrates a cross-sectional view of a display panel according to a fifth embodiment of the present disclosure.

FIG. 6 illustrates a cross-sectional view of a display panel 50 according to a fifth embodiment of the present disclosure, and illustrates an embodiment where a partition is added to the display panel illustrated in FIG. 4. Hereinafter, therefore, only the partition will be described in detail, like reference numerals refer to like elements as in the other elements of FIG. 4, and repetitive descriptions are omitted or will be briefly given.

With reference to FIG. 6, in the display panel 50 according to the fifth embodiment of the present disclosure, a partition 270 may be provided between first and second vibration generating modules 230-1 and 230-2 and may separate a vibration generated by the first vibration generating module 230-1 from a vibration generated by the second vibration generating module 230-2. For example, the partition 270 may block or prevent the transfer of a vibration, generated by the first vibration generating module 230-1 in a first region A1 of the display panel 50, to a second region A2 of the display panel 50, or may block or prevent the transfer of a vibration, generated by the second vibration generating module 230-2 in the second region A2 of the display panel 40, to the first region A1 of the display panel 40. Accordingly, the partition 270 may separate a left sound from a right sound, thereby enhancing a sound output characteristic of the display panel 50.

The partition 270 according to an embodiment may be provided to have a slit pattern formed in an adhesive member 250 between the first and second vibration generating modules 230-1 and 230-2.

The slit pattern may be formed by removing a portion, corresponding to a certain width, of the adhesive member 250 disposed on a rear center line CL of the display panel 50. In this case, the adhesive member 250 may have a horizontal symmetrical structure with respect to the rear center line CL of the display panel 50. The slit pattern may form an empty space which is provided by removing a portion of the adhesive member 250 disposed between the first and second vibration generating modules 230-1 and 230-2, and may be referred to as an air gap or an air line, but is not limited thereto.

Therefore, the display panel 50 according to the fifth embodiment of the present disclosure may have the same effect as that of the display panel 40 illustrated in FIG. 4, and may separate the left and right sounds by using the partition 270 to output a two-channel stereo sound.

Figure 7:
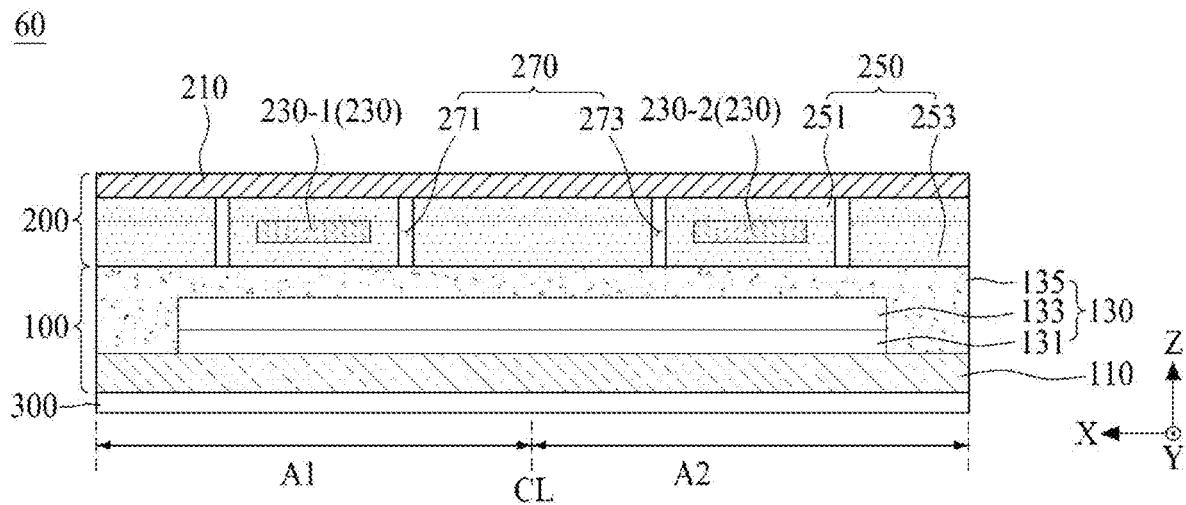
FIG. 7 illustrates a cross-sectional view of a display panel according to a sixth embodiment of the present disclosure.
Figure 8:
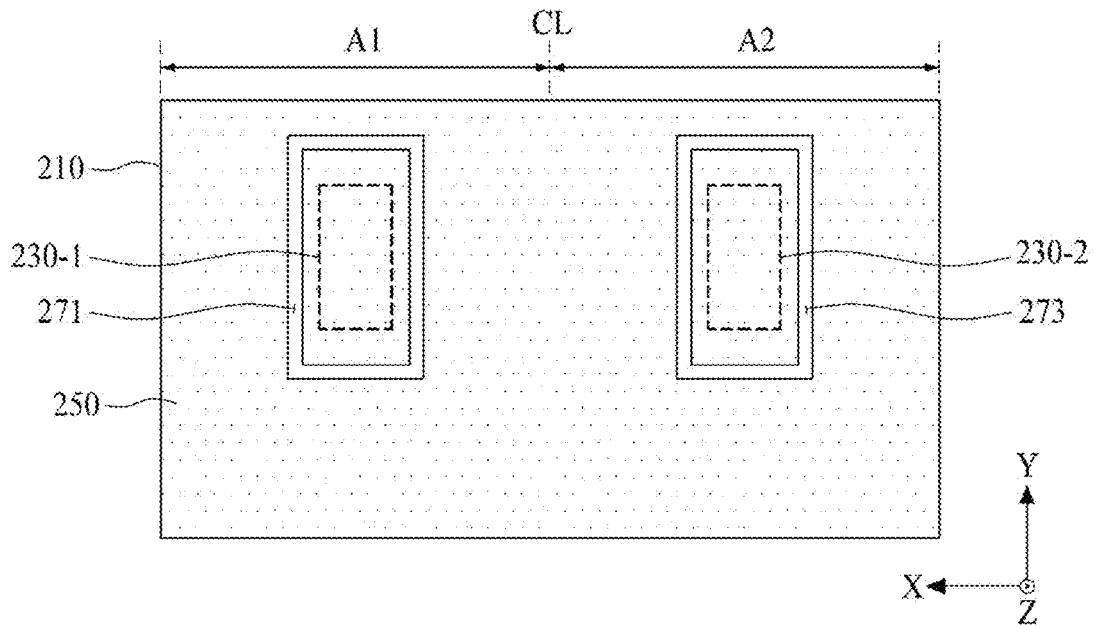
FIG. 8 illustrates a plan view of a display panel illustrated in FIG. 7, and including a vibration generating module and a partition.

FIG. 7 illustrates a cross-sectional view of a display panel 60 according to a sixth embodiment of the present disclosure, and FIG. 8 illustrates a vibration generating module and a partition each illustrated in FIG. 7. FIGS. 7 and 8 are diagrams of an embodiment where a partition is added to the display panel illustrated in FIG. 4. Hereinafter, therefore, only the partition will be described in detail, like reference numerals refer to like elements as in the other elements of FIG. 4, and repetitive descriptions are omitted or will be briefly given.

With reference to FIGS. 7 and 8, in the display panel 60 according to the sixth embodiment of the present disclosure, a partition 270 may include a first partition 271 and a second partition 273.

The first partition 271 may be provided in a first region A1 of the display panel 60 to surround a first vibration generating module 230-1. For example, the first partition 271 may have a circular shape, an elliptical shape, or a polygonal shape, but is not limited thereto.

The first partition 271 according to an embodiment may be provided in a first slit pattern provided in the adhesive member 250 to surround the first vibration generating module 230-1. The first slit pattern may have a circular shape, an elliptical shape, or a polygonal shape. The first slit pattern may be formed to surround the first vibration generating module 230-1 through a patterning process of removing the adhesive member 250, disposed in the first region A1 of the display panel 60, in a closed-loop line shape. The first slit pattern may form an empty space which is provided by removing a portion of the adhesive member 250, and may be referred to as an air gap or a closed-loop air line, but is not limited thereto.

The first partition 271 may limit (or define) a first vibration region (or vibration area) based on the first vibration generating module 230-1, and thus, may control a characteristic of a reproduction sound band and a sound pressure characteristic of a left sound generated from a vibration of the first vibration generating module 230-1. The first partition 271 according to an embodiment may be provided so that a size of the first vibration region (or vibration area) based on the first vibration generating module 230-1 is 1.5 or more times a size of the first vibration generating module 230-1. For example, in the first region A1 of the display panel 60, as the first vibration region limited by the first partition 271 increases, the vibration area may increase, and thus, a sound characteristic or a vibration characteristic of a low-pitched sound band may increase. Also, in the first region A1 of the display panel 60, as the first vibration region limited by the first partition 271 decreases, the vibration area may decrease, and thus, the sound characteristic or the vibration characteristic of the low-pitched sound band may decrease. Accordingly, a size and a shape of the first partition 271 (or the first slit pattern) may be adjusted based on a characteristic of a reproduction sound band and a sound pressure characteristic of a sound band needed based on a vibration of the display panel 60.

The second partition 273 may be provided in a second region A2 of the display panel 60 to surround the second vibration generating module 230-2. For example, the second partition 273 may have the same shape as that of the first partition 271, for horizontal symmetricity between the left sound and the right sound.

The second partition 273 according to an embodiment may be provided in a second slit pattern provided in the adhesive member 250 to surround the second vibration generating module 230-2. The second slit pattern may have the same shape as that of the first slit pattern. The second slit pattern may be formed to surround the second vibration generating module 230-2 through a patterning process of removing the adhesive member 250, disposed in the second region A2 of the display panel 60, in a closed-loop line shape. The second slit pattern may have the same shape as that of the first slit pattern, for horizontal symmetricity between the left sound and the right sound, and thus, description relevant thereto is omitted.

The partition 270 of the display panel 60 according to the sixth embodiment of the present disclosure may further include a third partition which is formed by removing a portion, corresponding to a certain width, of the adhesive member 250 disposed on a rear center line CL of the display panel 60.

The third partition may be configured to have a slit pattern provided in the adhesive member 250 between the first and second vibration generating modules 230-1 and 230-2. The third partition may be provided between the first and second vibration generating modules 230-1 and 230-2 and may spatially separate a vibration region based on the first vibration generating module 230-1 from a vibration region based on the second vibration generating module 230-2. The third partition may be the same as the partition 270 illustrated in FIG. 6, and thus, its repetitive description is omitted.

Therefore, the display panel 60 according to the sixth embodiment of the present disclosure may have the same effect as that of the display panel 40 illustrated in FIG. 4 and may limit a vibration region based on each of the first and second vibration generating modules 230-1 and 230-2 by using the first and second partitions 271 and 273, thereby realizing a characteristic of a reproduction sound band and a sound pressure characteristic of a desired sound band. Also, the display panel 60 according to the sixth embodiment of the present disclosure may separate the left and right sounds by using the third partition provided between the first and second vibration generating modules 230-1 and 230-2 to output a two-channel stereo sound.

Figure 9:
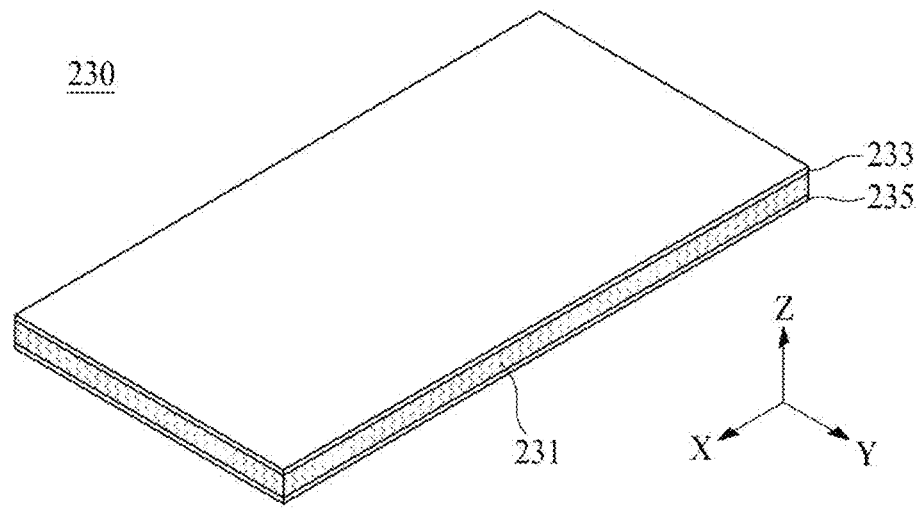
FIG. 9 illustrates a vibration generating module according to an embodiment of the present disclosure.

FIG. 9 illustrates a vibration generating module 230 according to an embodiment of the present disclosure, and illustrates a structure of the vibration generating module (vibration module) each illustrated in FIGS. 1 to 8.

With reference to FIG. 9, the vibration generating module 230 according to an embodiment of the present disclosure may include a piezoelectric layer 231, a first electrode layer 233, and a second electrode layer 235.

The piezoelectric layer 231 may include an inorganic material or a piezoelectric material which vibrates based on a piezoelectric effect (or a piezoelectric characteristic) caused by an electric field. The piezoelectric layer 231 may be implemented as a thin film type having a piezoelectric characteristic and flexibility, and thus, may be bent based on bending of a display panel. For example, the piezoelectric layer 231 may be referred to as an electroactive portion, an inorganic material portion, a piezoelectric material portion, or a vibration portion, but is not limited thereto.

The piezoelectric layer 231 according to an embodiment may include a piezoelectric polymer, piezoelectric ceramic, or a polymer/ceramic composite, but is not limited thereto.

The piezoelectric layer 231 according to an embodiment may be formed of a ceramic-based material for generating a relatively high vibration, or may be formed of piezoelectric ceramic having a perovskite-based crystalline structure. The perovskite crystalline structure may have a piezoelectric effect and an inverse piezoelectric effect, and may be a plate-shaped structure having orientation. The perovskite crystalline structure may be represented by a chemical formula "$ABO_3$". Here, 'A' may include a divalent metal element, and 'B' may include a tetravalent metal element. For example, in the chemical formula "$ABO_3$", 'A' and 'B' may be cations, and 'O' may be anions. For example, the perovskite-based crystalline structure may include one of $PbTiO_3$, $PbZrO_3$, $BaTiO_3$, and $SrTiO_3$, but is not limited thereto.

In a case where the perovskite crystalline structure includes a center ion (for example, $PbTiO_3$), a position of a Ti ion may be changed by an external stress or a magnetic field, and thus, polarization may be changed, thereby generating a piezoelectric effect. For example, in the perovskite crystalline structure, a cubic shape corresponding to a symmetric structure may be changed to a tetragonal, orthorhombic, or rhombohedral structure corresponding to an unsymmetric structure, and thus, a piezoelectric effect may be generated. In a tetragonal, orthorhombic, or rhombohedral structure corresponding to an unsymmetric structure, polarization may be high in a morphotropic phase boundary, and realignment of polarization may be easy, whereby the perovskite crystalline structure may have a high piezoelectric characteristic.

For example, the piezoelectric layer 231 may include one or more materials of lead (Pb), zirconium (Zr), titanium (Ti), zinc (Zn), nickel (Ni), and niobium (Nb), but is not limited thereto.

As another example, the piezoelectric layer 231 may include a lead zirconate titanate (PZT)-based material including lead (Pb), zirconium (Zr), and titanium (Ti) or may include a lead zirconate nickel niobate (PZNN)-based material including lead (Pb), zinc (Zn), nickel (Ni), and niobium (Nb), but is not limited thereto. Also, the inorganic material portion may include at least one of $CaTiO_3$, $BaTiO_3$, and $SrTiO_3$ each without lead (Pb), but is not limited thereto.

The first electrode layer 233 may be disposed on a first surface (or a front surface) of the piezoelectric layer 231 and may be electrically connected to a first surface of the piezoelectric layer 231. The first electrode layer 233 according to an embodiment may include a transparent conductive material, a semitransparent conductive material, or an opaque conductive material. Examples of the transparent conductive material or the semitransparent conductive material may include indium tin oxide (ITO) or indium zinc oxide (IZO), but are not limited thereto. Examples of the opaque conductive material may include aluminum (Al), copper (Cu), gold (Au), silver (Ag), molybdenum (Mo), magnesium (Mg), or an alloy thereof, but are not limited thereto.

The second electrode layer 235 may be disposed on a second surface (or a rear surface), which is opposite to the first surface, of the piezoelectric layer 231 and may be electrically connected to a second surface of the piezoelectric layer 231. The second electrode layer 235 according to an embodiment may include a transparent conductive material, a semitransparent conductive material, or an opaque conductive material. For example, the second electrode layer 235 may include the same material as that of the first electrode layer 233.

The piezoelectric layer 231 may be polarized by a certain voltage applied to the first electrode layer 233 and the second electrode layer 235 in a certain temperature atmosphere or a temperature atmosphere which is changed from a high temperature to a room temperature.

The vibration generating module 230 according to an embodiment of the present disclosure may further include a protection film which covers the first electrode layer 233 and the second electrode layer 235.

The protection film may protect the first electrode layer 233 and the second electrode layer 235. For example, the protection film may be a polyimide (PI) film or a polyethyleneterephthalate (PET) film, but is not limited thereto.

The vibration generating module 230 according to an embodiment of the present disclosure may vibrate according to an electrical signal (for example, a voice signal or a haptic feedback signal) applied to the first electrode layer 233 and the second electrode layer 235 to vibrate the display panel.

Figure 10:
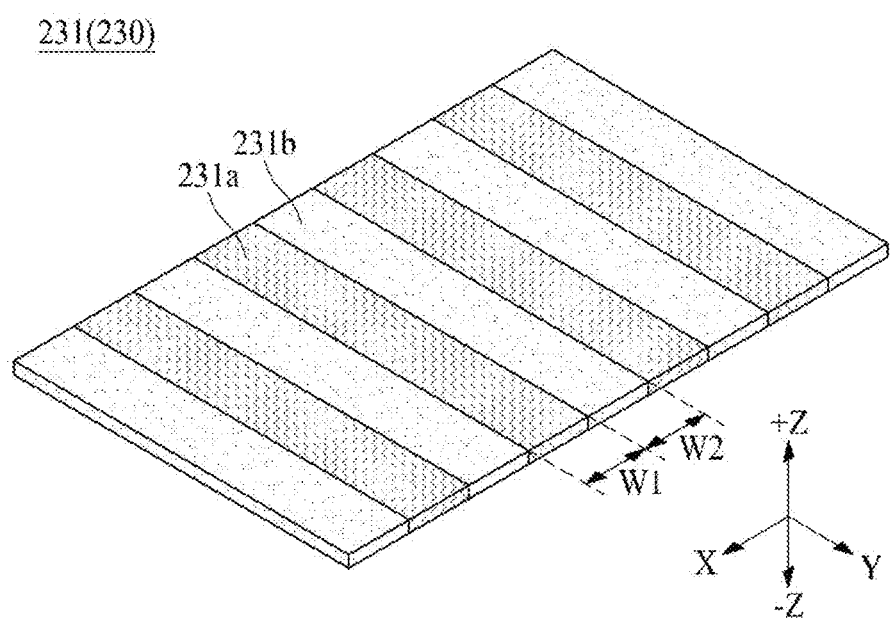
FIG. 10 illustrates a modification embodiment of a piezoelectric layer illustrated in FIG. 9.

FIG. 10 illustrates a modification embodiment of the piezoelectric layer illustrated in FIG. 9.

With reference to FIGS. 9 and 10, a piezoelectric layer 231 according to a modification embodiment of the present disclosure may include a plurality of piezoelectric portions 231a and a plurality of flexible portions 231b each disposed between the plurality of piezoelectric portions 231a.

The plurality of piezoelectric portions 231a and the plurality of flexible portions 231b may be disposed (or arranged) on the same plane (or the same layer) in parallel. For example, in the piezoelectric layer 231 (or a vibration generating module), vibration energy based on a link in a unit lattice of each piezoelectric portion 231a may increase by a corresponding flexible portion 231b, and thus, a vibration may increase and a piezoelectric characteristic and flexibility may be secured. Also, in the piezoelectric layer 231 (or the vibration generating module), the flexible portions 231b and the piezoelectric portions 231a may be alternately disposed on the same plane in a lengthwise direction X with respect to one side of the piezoelectric layer 231, and thus may configure a large-area composite film (or an organic/inorganic composite film) having a single-layer structure. The large-area composite film may have flexibility due to the plurality of flexible portions 231b, and this flexibility may be greater than that of the piezoelectric layer (or the vibration generating module) illustrated in FIG. 9.

Each of the plurality of piezoelectric portions 231a may include a polygonal pattern. For example, the plurality of piezoelectric portions 231a may each include a line pattern having a first width W1, may be spaced apart from one another by a second width W2 (or a certain interval or distance) in a first direction X, and may be disposed in parallel in a second direction Y intersecting the first direction X. Each of the plurality of piezoelectric portions 231a may have the same size (for example, the same width, area, or volume) within a process error range (or an allowable error or a tolerance) occurring in a manufacturing process.

Each of the plurality of piezoelectric portions 231a according to an embodiment may include an inorganic material or a piezoelectric material which vibrates based on a piezoelectric characteristic caused by an electric field. For example, each of the plurality of piezoelectric portions 231a may be referred to as an electroactive portion, an inorganic material portion, a piezoelectric material portion, or a vibration portion, but is not limited thereto. Each of the plurality of piezoelectric portions 231a may include the same material as that of the piezoelectric layer 230 illustrated in FIG. 9, and thus, repetitive description is omitted.

Each of the plurality of flexible portions 231b may include a polygonal pattern. The plurality of flexible portions 231b may each be disposed between two adjacent piezoelectric portions of the plurality of piezoelectric portions 231a, may improve an impact resistance of the piezoelectric portions 231a, and may provide flexibility to the flexible vibration module 230. Each of the plurality of flexible portions 231b may be referred to as an organic material portion, an elastic portion, a bending portion, a damping portion, or a connection portion each having flexibility, but is not limited thereto.

The plurality of flexible portions 231b and the plurality of piezoelectric portions 231a may be disposed (or arranged) on the same plane (or the same layer) in parallel. Each of the plurality of flexible portions 231b may be configured to fill a gap or space between two adjacent piezoelectric portions of the plurality of piezoelectric portions 231a and may be connected to or attached on a piezoelectric portion 231a adjacent thereto. For example, the plurality of flexible portions 231b may each include a line pattern having a second width W2 and may be disposed in parallel with a corresponding piezoelectric portion 231a between two adjacent flexible portions 231b. Each of the plurality of flexible portions 231b may have the same size (for example, the same width, area, or volume) within a process error range (or an allowable error or a tolerance) occurring in a manufacturing process. A size of each piezoelectric portion 231a and a size of each flexible portion 231b may be adjusted based on a requirement condition including the vibration characteristic and/or flexibility of the vibration generating module 230. For example, in a display panel requiring a piezoelectric characteristic rather than flexibility, a size of each piezoelectric portion 231a may be adjusted to be greater than that of each flexible portion 231b. As another example, in a display panel requiring flexibility rather than a piezoelectric characteristic, a size of each flexible portion 231b may be adjusted to be greater than that of each piezoelectric portion 231a.

Each of the plurality of flexible portions 231b according to an embodiment may have modulus and viscoelasticity which are lower than those of each piezoelectric portion 231a, and thus, may enhance the reliability of each piezoelectric portion 231a vulnerable to an impact due to a brittleness characteristic. For example, when the vibration generating module 230 for vibrating the display panel has an impact resistance and high stiffness, the vibration generating module 230 may have a maximum vibration characteristic. In order for the vibration generating module 230 to have an impact resistance and high stiffness, the plurality of flexible portions 231b may each include a material having a relatively high damping factor (tan δ) and relatively high stiffness. For example, the plurality of flexible portions 231b may each include a material having a damping factor (tan δ) of about 0.1 [Gpa] to about 1 [Gpa] and relatively high stiffness of about 0 [Gpa] to about [Gpa]. Also, a damping factor (tan δ) and a stiff characteristic may be described based on a correlation between a loss coefficient and modulus, and in this case, the plurality of flexible portions 231b may each include a material having a loss coefficient of about 0.01 to about 1 and modulus of about 1 [Gpa] to about 10 [Gpa].

The plurality of flexible portions 231b may each include an organic material or an organic polymer which has a flexible characteristic in comparison with the piezoelectric portions 231a. For example, the plurality of flexible portions 231b may each include an organic material, an organic polymer, an organic piezoelectric material, or an organic non-piezoelectric material.

The plurality of flexible portions 231b according to an embodiment may each include at least one of an organic piezoelectric material and an organic non-piezoelectric material.

Each of the flexible portions 231b including an organic piezoelectric material may absorb an impact applied to a corresponding piezoelectric portion 231a, and thus, may enhance the total durability of the vibration generating module 230 and may provide a piezoelectric characteristic corresponding to a certain level or more. The organic piezoelectric material according to an embodiment may be an organic material having an electroactive material. For example, the organic piezoelectric material may include at least one of polyvinylidene fluoride (PVDF), P-Polyvinylidene fluoride ((3-PVDF), and polyvinylidene-trifluoroethylene (PVDF-TrFE), but is not limited thereto.

Each of the flexible portions 231b including an organic non-piezoelectric material may include a curable resin composition and an adhesive including the curable resin composition, and thus, may absorb an impact applied to a corresponding piezoelectric portion 231a, thereby enhancing the total durability of the vibration generating module 230. The organic non-piezoelectric material according to an embodiment may include at least one of an epoxy-based polymer, an acryl-based polymer, and a silicon-based polymer, but is not limited thereto.

For example, each of the flexible portions 231b including an organic non-piezoelectric material may include an adhesion promoter or an adhesion enhancing agent for adhesiveness between epoxy resin and an inorganic material portion, for a high stiffness characteristic needed for the vibration generating module 230. In an example, the adhesion promoter or an adhesion enhancing agent may be phosphate or the like. The organic material portion may be cured by at least one curing process of a thermal curing process and a photo-curing process. In a process of curing the organic material portion, solvent-free type epoxy resin may be used for preventing the thickness uniformity of the vibration generating module 230 from being reduced by contraction of the organic material portion caused by volatilization of a solvent.

Moreover, each of the flexible portions 231b including the organic non-piezoelectric material may further include a reinforcing agent, for a damping characteristic in addition to high stiffness of the vibration generating module 230. For example, the reinforcing agent may be methylmethacrylate-butadiene-styrene (MBS) having a core shell type, and a content thereof may be about 5 wt % to about 40 wt %. The reinforcing agent may be an elastic body having the core cell type and may have a high coupling force to epoxy resin such as an acryl-based polymer, and thus, may enhance an impact resistance or a damping characteristic of the vibration generating module 230.

In the piezoelectric layer 231 according to the present embodiment, the flexible portions 231b including an organic material and having flexibility, and the piezoelectric portions 231a including an inorganic material and having a piezoelectric characteristic, may be alternately repeated and disposed on the same plane in a lengthwise direction X of the vibration generating module 230, and thus may configure a large-area composite film (or an organic/inorganic composite film) having a single-layer structure. The large-area composite film may have flexibility due to the plurality of flexible portions 231b.

The piezoelectric layer 231 according to the present embodiment may vibrate with an electric field based on a signal applied to each of the plurality of piezoelectric portions 231a having a line pattern, and thus, both ends in a first lengthwise direction X may be folded in an upward direction +Z or folded in a downward direction −Z. For example, each of the plurality of flexible portions 231b filled or disposed between two adjacent first portions of the plurality of piezoelectric portions 231a may have flexibility, and thus, even when the both ends EP of the piezoelectric layer 231 are bent in the upward direction +Z or the downward direction −Z, the inorganic material portion—which is each piezoelectric portion 231a—may not be damaged or reduced in performance. Also, the vibration generating module 230 including the piezoelectric layer 231 according to the present embodiment may be applied to a flexible display apparatus, and for example, may be applied to a curved display apparatus bent at a certain curvature radius, but is not limited thereto, and may be applied to a rollable display apparatus wound in a spiral form, a bendable display apparatus, a wearable display apparatus wound around a wrist, or a commercial display apparatus having a plurality of curved portions. In this case, the vibration generating module 230 may be implemented to be bent based on a certain curvature radius, or to be bent based on winding in a spiral shape or unwinding, and may be embedded into the display panel 10, or may be embedded into the display panel 10 to be disposed at a predetermined distance in the display panel 10 relative to other vibration generating modules 230.

Therefore, the piezoelectric portions 231a and the flexible portions 231b may be alternately repeated and connected to one another, and thus, the vibration generating module 230 including the piezoelectric layer 231 according to a modification embodiment of the present disclosure may be implemented as a thin film type. Therefore, the vibration generating module 230 may be bent based on a shape of the display panel and may have a size corresponding to the display panel, or may have a size for realizing a vibration characteristic or a sound characteristic which is each set based on a vibration of the display panel. Accordingly, in the vibration generating module 230 including the piezoelectric layer 231 according to a modification embodiment of the present disclosure, a size of the piezoelectric layer 231 may be adjusted based on a characteristic needed for the display panel, and thus, it may be easy to design.

Figure 11:
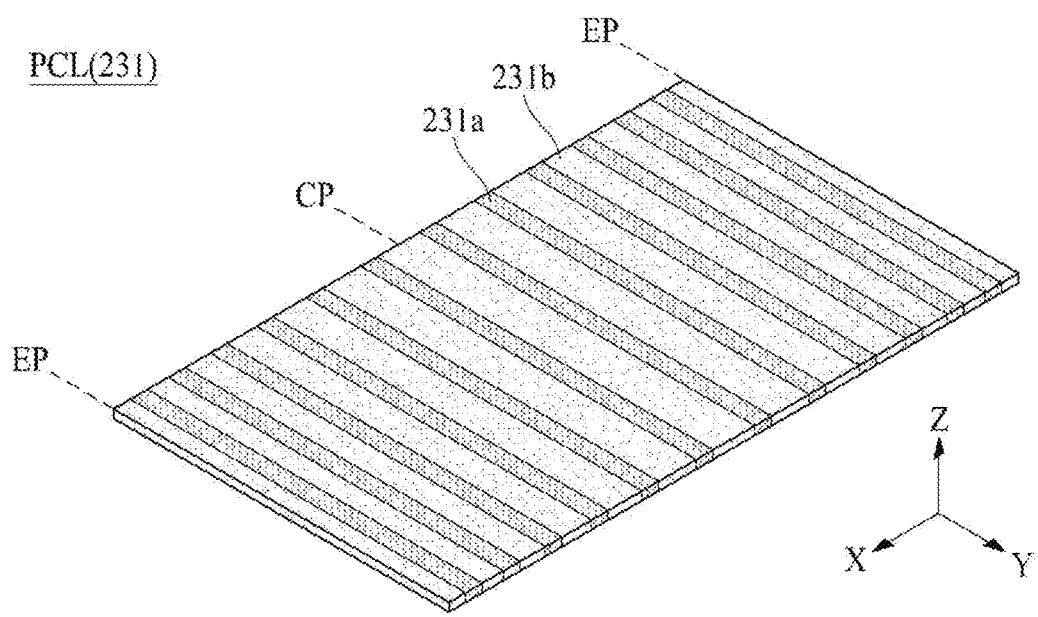
FIG. 11 illustrates a piezoelectric layer according to another modification embodiment of the present disclosure.
Figure 12:
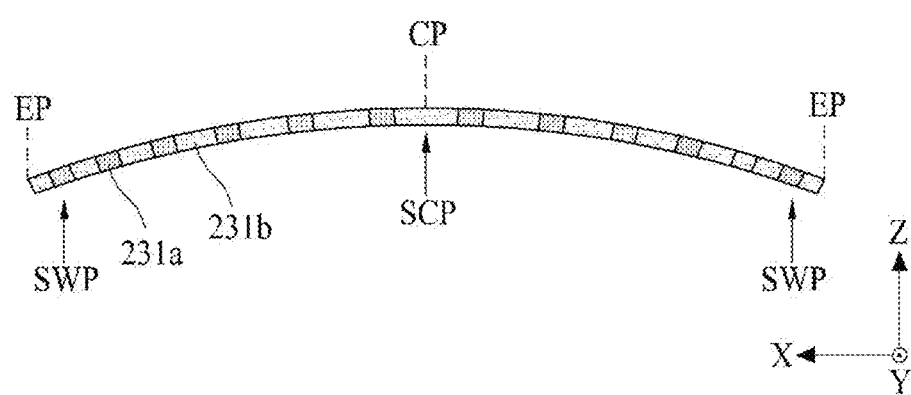
FIG. 12 illustrates an example where both ends of a piezoelectric layer illustrated in FIG. 11 are folded downward.

FIG. 11 illustrates a piezoelectric layer 231 according to another modification embodiment of the present disclosure, and FIG. 12 illustrates an example where both ends of a piezoelectric layer illustrated in FIG. 11 are folded downward. FIGS. 11 and 12 illustrate an embodiment implemented by modifying the flexible portions illustrated in FIG. 10, and thus, repetitive description is omitted or will be briefly given below.

With reference to FIGS. 11 and 12, in the piezoelectric layer 231 according to another modification embodiment of the present disclosure, a size (or a width) of each of a plurality of flexible portions 231a disposed between a plurality of piezoelectric portions 231a may progressively decrease in a direction from a center portion CP to both edges or both peripheries (or both ends) EP of a vibration generating module 200.

A flexible portion 231b having a largest size of the plurality of flexible portions 231b may be located in a portion SCP on which a highest stress concentrates when the vibration generating module 230 is vibrating in a vertical direction Z, and a flexible portion 231b having a smallest size of the plurality of flexible portions 231b may be located in a portion SWP where a relatively low stress occurs when the vibration generating module 230 is vibrating in the vertical direction Z. For example, the flexible portion 231b having the largest size of the plurality of flexible portions 231b may be located in the center portion CP of the vibration generating module 230, and the flexible portion 231b having the smallest largest size of the plurality of flexible portions 231b may be located in each of the both edges or both peripheries EP of the vibration generating module 230. Therefore, when the vibration generating module 230 is vibrating in the vertical direction Z, interference of a sound wave or overlapping a resonance frequency each occurring in the portion SCP on which the highest stress concentrates may be minimized, and thus, dipping of a sound pressure occurring in the low sound band may be reduced, thereby improving flatness of a sound characteristic in the low sound band. Here, flatness of a sound characteristic may be a level of a deviation between a highest sound pressure and a lowest sound pressure.

The center portion CP of the vibration generating module 230 may overlap a flexible portion 231b. For example, the center portion CP of the vibration generating module 230 may overlap a center of the flexible portion 231b. In this case, when the vibration generating module 230 is vibrating in the vertical direction Z, flexibility of the center portion CP of the vibration generating module 230 may increase. For example, in a case where the center portion CP of the vibration generating module 230 overlaps a piezoelectric portion 231a or corresponds to the piezoelectric portion 231a, when the vibration generating module 230 is vibrating in the vertical direction Z, the piezoelectric portion 231a may be damaged or reduced in performance due to stress concentrating on the center portion CP of the vibration generating module 230. Accordingly, in a case where the center portion CP of the vibration generating module 230 overlaps a flexible portion 231b or corresponds to the flexible portion 231b, when the vibration generating module 230 is vibrating in the vertical direction Z, the flexible portion 231b may not be damaged or reduced in performance in the portion SCP on which stress concentrates.

In an example, the plurality of piezoelectric portions 231a may have the same size (or width). As another example, the plurality of piezoelectric portions 231a may have different sizes (or widths). For example, a size (or a width) of each of the plurality of piezoelectric portions 231a may progressively decrease or increase in a direction from the center portion CP to both edges or both peripheries (or both ends) EP of the piezoelectric layer 231 of the vibration generating module 230. In this case, in the vibration generating module 230, a sound pressure characteristic of a sound may be enhanced and a reproduction sound band may increase, based on various natural vibration frequencies based on a vibration of each of the plurality of piezoelectric portions 231a having different sizes.

Therefore, the vibration generating module 230 including the piezoelectric layer 231 according to another modification embodiment of the present disclosure may have the same effect as that of the vibration generating module 230 including the piezoelectric layer 231 illustrated in FIG. 10, and may increase in flexibility.

Figure 13:
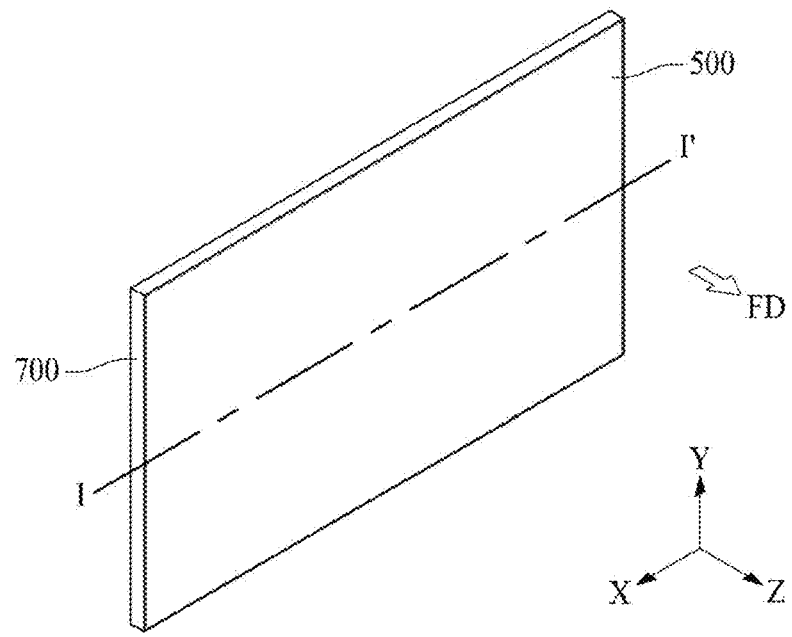
FIG. 13 illustrates a display apparatus according to an embodiment of the present disclosure.
Figure 14:
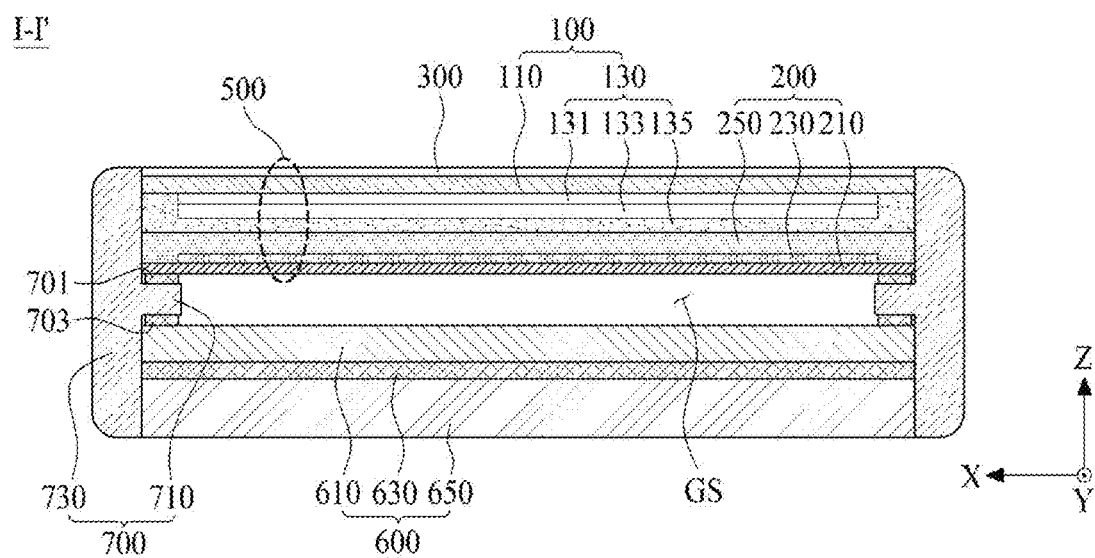
FIG. 14 illustrates a cross-sectional view taken along line I-I' illustrated in FIG. 13.

FIG. 13 illustrates a display apparatus according to an embodiment of the present disclosure, and FIG. 14 illustrates a cross-sectional surface taken along line I-I' illustrated in FIG. 13.

With reference to FIGS. 13 and 14, the display apparatus according to an embodiment of the present disclosure may include a display panel 500 and a rear structure 600.

The display panel 500 may autonomously vibrate based on a vibration of a vibration generating module 230 embedded thereinto while displaying an image, and thus, may directly output a sound (or a panel vibration sound) in a direction (or a forward region) FD toward a front surface thereof, or may generate a haptic feedback responding to a touch. Alternatively, the display panel 500 may autonomously vibrate based on a vibration of the vibration generating module 230 embedded thereinto in a state where an image is not displayed, and thus, may directly output the sound in the forward region FD in front of the display panel 500. Accordingly, the display panel 500 according to the present disclosure may perform an image display function, a sound generating (or output) function, and a haptic feedback function responding to a touch.

The display panel 500 according to an embodiment may be configured as one of the display panels 10 to 60 illustrated in FIGS. 1 to 8, and thus, repetitive description is omitted. Also, the vibration generating module 230 embedded into the display panel 500 may include one of the vibration generating modules illustrated in FIGS. 1 to 12, and thus, repetitive description is omitted.

The rear structure 600 may be disposed on a rear surface of the display panel 500. The rear structure 600 according to an embodiment may cover the rear surface of the display panel 500. The rear structure 600 may be referred to as a cover bottom, a plate bottom, a back cover, a base frame, a metal frame, a metal chassis, a chassis base, or an m-chassis. The rear structure 600 may function as a supporter which supports the display panel 500, and may be implemented as an arbitrary type frame or a plate structure disposed on a rear surface of the display apparatus. Also, the rear surface of the display panel 500 may be referred to as one surface, a first surface, or a lower surface, but the term is not limited thereto.

The rear structure 600 according to an embodiment may include a first rear cover 610 and a second rear cover 650. The first rear cover 610 may be disposed on the rear surface of the display panel 500 and may cover the rear surface of the display panel 500. The first rear cover 610 may be spaced apart from a rearmost surface of the display panel 500 with a gap space GS therebetween. The first rear cover 610 may protect the rear surface of the display panel 500 from an external impact. Also, the first rear cover 610 may perform a function of a heat dissipation plate for dissipating heat occurring in the display panel 500.

The first rear cover 610 according to an embodiment may be a plate member which covers the whole rear surface or entire rear surface of the display panel 500. For example, an edge or a corner of the first rear structure 610 may have an inclined shape or a curved shape through a chamfer process or a corner rounding process.

The first rear cover 610 according to an embodiment may include a glass material, a metal material, or a plastic material. For example, the first rear cover 610 including a glass material may include one of sapphire glass and gorilla glass or a stacked structure (or a junction structure) thereof, but is not limited thereto. For example, the first rear cover 610 including a metal material may include one material of aluminum (Al), an Al alloy, a Mg alloy, a Fe—Ni alloy, and stainless steel, or may include an alloy material thereof or a junction structure.

The second rear cover 650 may be disposed on a rear surface of the first rear cover 610 and may cover the rear surface of the first rear cover 610. The second rear cover 650 according to an embodiment may be a plate member which covers the whole rear surface or entire rear surface of the first rear cover 610. For example, an edge or a corner of the second rear structure 650 may have an inclined shape or a curved shape through a chamfer process or a corner rounding process.

The second rear cover 650 according to an embodiment may be formed of one of a glass material, a metal material, or a plastic material, or may be formed of a material differing from that of the first rear cover 610. For example, the second rear cover 650 may be formed of a glass material, and the first rear cover 610 may be formed of a metal material such as Al, which is good in thermal conductivity. In this case, the display apparatus may be improved in design appearance, based on the second rear cover 650 which is disposed on a rearmost surface and includes a glass material, and a rear surface of the display apparatus may use the first rear cover 610 including a metal material as a mirror surface.

The second rear cover 650 according to an embodiment may have a thickness, which is the same as or relatively thinner than that of the first rear cover 610, within an error range in a manufacturing process.

The first rear cover 610 and the second rear cover 650 according to an embodiment may be attached (e.g., coupled or connected) to each other by a cover coupling member 630. For example, the cover coupling member 630 may be an adhesive resin, a double-sided adhesive tape, or a double-sided adhesive foam pad, and may have elasticity for absorbing an impact.

According to an embodiment, the cover coupling member 630 may be disposed in a whole region or entire region between the first rear cover 610 and the second rear cover 650.

According to another embodiment, the cover coupling member 630 may be provided in a mesh structure including an air gap between the first rear cover 610 and the second rear cover 650.

The display apparatus according to an embodiment of the present disclosure may further include a middle frame 700.

The middle frame 700 may be disposed between a rear edge or a rear periphery of the display panel 500 and a front edge or a front periphery of the rear structure 600. The middle frame 700 may support an edge or a periphery of each of the display panel 500 and the rear structure 600 and may surround a side surface of each of the display panel 500 and the rear structure 600. The middle frame 700 may provide a gap space GS between the display panel 500 and the rear structure 600. The gap space GS may be referred to as an air gap, a vibration space, or a sound box, but the term is not limited thereto.

The middle frame 700 according to an embodiment may be attached (e.g., coupled or connected) to a rear edge or a rear periphery of the display panel 500 by a first adhesive member 701 and may be attached (e.g., coupled or connected) to a front edge or a front periphery of the rear structure 600 by a second adhesive member 703. The front surface of the rear structure 600 may be referred to as the other surface, a second surface, an upper surface, or a side surface, but the term is not limited thereto. Also, the middle frame 700 may include a middle cabinet, a middle cover, or a middle chassis, but the term is not limited thereto.

The middle frame 700 according to an embodiment may include a metal material or a plastic material. For example, the middle frame 700 may be formed of a metal material, for improving a side design appearance of the display apparatus and protecting side surfaces of the display apparatus.

The middle frame 700 according to an embodiment may include a supporting part 710 and a sidewall portion 730. The supporting part 710 may be disposed between the rear edge or a rear periphery of the display panel 500 and the front edge or a front periphery of the rear structure 600, and thus, may provide the gap space GS between the display panel 500 and the rear structure 600. A front surface of the supporting part 710 may be attached (e.g., coupled or connected) to the rear edge or a rear periphery of the display panel 500 by the first adhesive member 701, and a rear surface of the supporting part 710 may be attached (e.g., coupled or connected) to the front edge or a front periphery of the rear structure 600 by the second adhesive member 703.

The supporting part 710 according to an embodiment may have a single tetragonal picture frame structure, but is not limited thereto. For example, the supporting part 710 may be disposed between the rear edge or a rear periphery of the display panel 500 and the front edge or a front periphery of the rear structure 600 to have a plurality of division bar shapes.

The first adhesive member 701 may be disposed between the rear edge or a rear periphery of the display panel 500 and a front surface of the supporting part 710. In an example, the first adhesive member 701 may be an adhesive resin, a double-sided adhesive tape, or a double-sided adhesive foam pad, but is not limited thereto.

The second adhesive member 703 may be disposed between the front edge or a front periphery of the rear structure 600 and a rear surface of the supporting part 710. In an example, the second adhesive member 703 may be an adhesive resin, a double-sided adhesive tape, or a double-sided adhesive foam pad. The second adhesive member 703 may be formed of a material differing from that of the first adhesive member 701.

The sidewall portion 730 may be vertically attached (e.g., coupled or connected) to an outer surface of the supporting part 710 in parallel with a thickness direction Z of the display apparatus. The sidewall portion 730 may surround all of an outer surface (or an outer sidewall) of the display panel 500 and an outer surface (or an outer sidewall) of the rear structure 600, thereby protecting the outer surface of each of the display panel 500 and the rear structure 600 and improving a design appearance of a side surface of the display apparatus. The middle frame 700 according to an embodiment may be configured as a single body, and thus, may have a picture frame structure having a "⊢"-shaped single-sided structure.

The display apparatus according to an embodiment of the present disclosure may include a panel coupling member instead of the middle frame 700.

The panel coupling member may be disposed between the rear edge or a rear periphery of the display panel 500 and the front edge or a front periphery of the rear structure 600, and may provide the gap space GS between the display panel 500 and the rear structure 600. The panel coupling member may perform the same function as that of each of the side wall part 730 and the supporting part 710 of the middle frame 700.

In a case where the display apparatus includes the panel coupling member instead of the middle frame 700, the rear structure 600 may include a sidewall cover part which surrounds all of an outer surface (or an outer sidewall) of the display panel 500, an outer surface (or an outer sidewall) of the rear structure 600, and an outer surface (or an outer sidewall) of the panel coupling member.

The sidewall cover part may extend from an end of the second rear cover 650 and may be vertically bent to be parallel to a thickness direction Z of the display apparatus. The sidewall cover part according to an embodiment may have a single sidewall structure or a hemming structure. The hemming structure may denote a structure where ends of an arbitrary member are bent in a curved shape to overlap each other, or are spaced apart from each other in parallel. For example, the sidewall cover part having the hemming structure may include a first sidewall, which extends from the end of the second rear cover 650 and is vertically bent to be parallel to the thickness direction Z of the display apparatus, and a second sidewall which extends from an end of a first sidewall and is bent to be parallel to the first sidewall. The second sidewall may be disposed between the outer surface of the display panel 500 and the first sidewall, and in this case, the second sidewall may not be exposed at an outermost side surface of the display apparatus and may be covered by the first sidewall, thereby improving a side appearance design of the display apparatus.

Therefore, the display apparatus according to an embodiment of the present disclosure may output a sound, generated based on a vibration of the display panel 500 caused by a vibration of the vibration generating module 230 embedded into the display panel 500, to a forward region FD in front of the display panel 500, thereby enhancing immersion of a viewer watching an image displayed by the display panel 500. Also, in the display apparatus according to an embodiment of the present disclosure, even without configuring a separate haptic driving apparatus, the display panel 500 may vibrate based on the vibration of the vibration generating module 230 embedded into the display panel 500 to provide a user with a haptic feedback responding to a user touch applied to the display panel 500.

Moreover, in the display apparatus according to an embodiment of the present disclosure, because a sound is generated based on a vibration of the display panel 500, a separate speaker may not be provided, thereby enhancing a design of a set apparatus and a degree of freedom in disposition of elements.

Moreover, because the vibration generating module 230 is embedded into the display panel 500, the display apparatus according to an embodiment of the present disclosure may have a clean back design where the vibration generating module 230 is not exposed at all or is not seen by a user, thereby improving a rear design appearance of the display apparatus.

Moreover, in the display apparatus according to an embodiment of the present disclosure, the vibration generating module 230 and the display panel 500 may be modularized as one element, and thus, an assembly process performed on the vibration generating module 230 and a mechanical element may be omitted, thereby improving assemblability to enhance a production yield rate.

Figure 15:
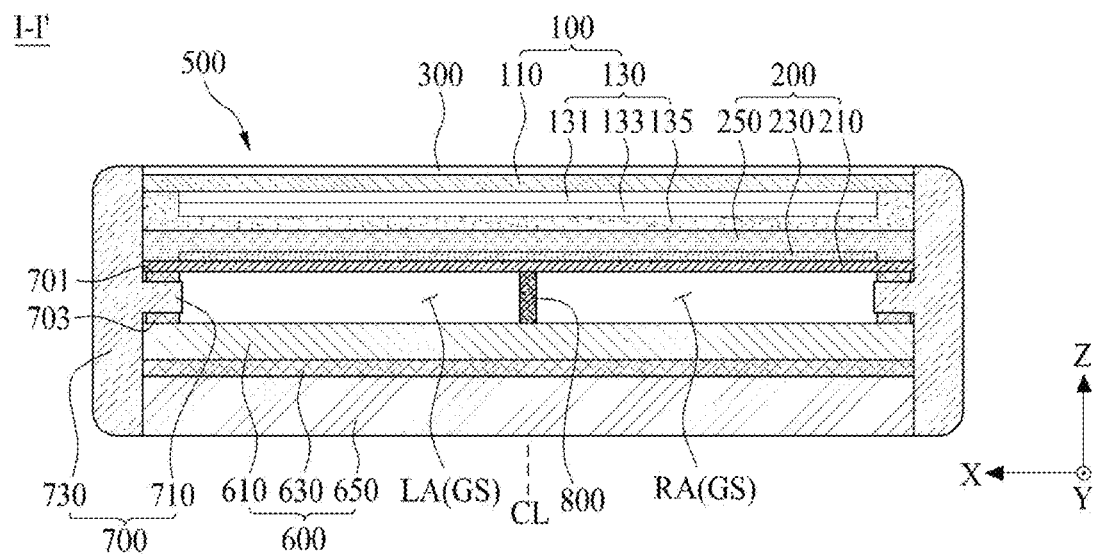
FIG. 15 illustrates another cross-sectional view taken along line I-I' illustrated in FIG. 13.

FIG. 15 illustrates another cross-sectional surface taken along line I-I' illustrated in FIG. 13 and illustrates an embodiment where a sound separation member is added to the display apparatus illustrated in FIGS. 13 and 14. Hereinafter, therefore, only the sound separation member will be described in detail, like reference numerals refer to like elements as in the other elements of FIG. 14, and their repetitive descriptions are omitted or will be briefly given.

With reference to FIG. 15, in a display apparatus according to an embodiment of the present disclosure, a sound separation member 800 may be disposed between a display panel 500 and a rear structure 600 and may divide a gap space GS, provided between the display panel 500 and a rear structure 600, into a first gap region LA and a second gap region RA.

The sound separation member 800 (or a space division member) according to an embodiment may be disposed between the display panel 500 and the rear structure 600 to overlap a rear center line CL of the display panel 500. The sound separation member 800 may divide the gap space GS, provided between the display panel 500 and the rear structure 600, into the first gap region LA and the second gap region RA and may support a rear center portion of the display panel 500. For example, the sound separation member 800 may separate panel vibration sounds which are generated by the vibration generating module 230 embedded into the display panel 500 in a first region (or a left region) and a second region (or a right region) of the display panel 500. The sound separation member 800 may block or prevent a vibration, generated in the first region of the display panel 500, to the second region of the display panel 500, or may block or prevent a vibration, generated in the second region of the display panel 500, to the first region of the display panel 500. Also, the sound separation member 800 may attenuate or absorb a vibration of the display panel 500 at a center of the display apparatus, and thus, may block or prevent a sound, generated in the first region of the display panel 500, to the second region of the display panel 500 or may block or prevent a sound, generated in the second region of the display panel 500, to the first region of the display panel 500. Accordingly, the sound separation member 800 may separate a left sound and a right sound, thereby enhancing a sound output characteristic of the display apparatus.

In an example, the sound separation member 800 may include polyurethane or polyolefin, but is not limited thereto. As another example, the sound separation member 800 may include a single-sided adhesive tape or a double-sided adhesive tape, and for example, may be formed of a material having an elastic force which enables compression to be made to a certain degree.

Therefore, the display apparatus including the sound separation member 800 according to the present embodiment may output, through the sound separation member 800, a left sound and a right sound to a forward region in front of the display panel 500 to provide a stereo sound to a user. Also, the display apparatus according to an embodiment of the present disclosure may separate the left sound and the right sound by using the sound separation member 800 to output a two-channel stereo sound to the forward region in front of the display panel 500.

Figure 16:
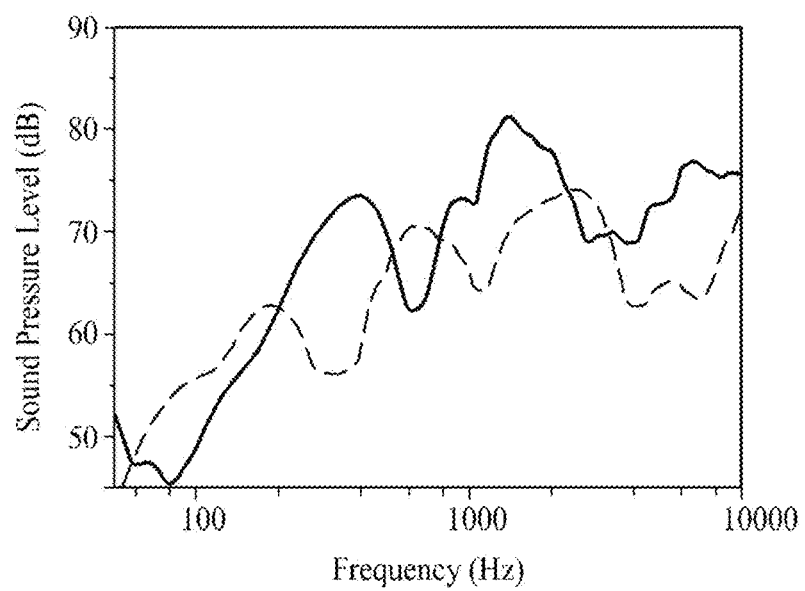
FIG. 16 is a graph showing a sound pressure characteristic of each of the display panel according to the first embodiment and the display panel according to the third embodiment.

FIG. 16 is a graph showing a sound pressure characteristic of each of the display panel according to the first embodiment of the present disclosure and the display panel according to the third embodiment. In the sound pressure measurement of FIG. 16, Audio Precision company's APX525 has been used, a sine sweep has been applied at 50 Hz to 10 kHz, and a sound pressure has been measured at a position space apart from a display panel, a flexible vibration module, and a film speaker by 10 cm. The sine sweep may be a process of performing a sweep for a short time, but a process is not limited thereto. In FIG. 16, the abscissa axis represents a frequency (Hz), and the ordinate axis represents a sound pressure level (dB).

As shown in FIG. 16, comparing with the display panel (graphed as a thick solid line) according to the first embodiment of the present disclosure illustrated in FIG. 1, it may be seen that, because the display panel (graphed as a dotted line) according to the third embodiment of the present disclosure illustrated in FIG. 3 is spaced apart from the second substrate, a sound pressure characteristic is slightly reduced in a high-pitched sound band, but the display panel according to the third embodiment has a high sound pressure characteristic or an expanded reproduction sound band in a low-pitched sound band of about 500 Hz or less. Therefore, according to a sound pressure characteristic of the display panel (the thick solid line) according to the first embodiment of the present disclosure, a vibration generating module embedded into a display panel relatively requiring a sound pressure characteristic of the high-pitched sound band may be configured to contact the second substrate as illustrated in FIG. 1. Also, according to a sound pressure characteristic of the display panel (the dotted line) according to the third embodiment of the present disclosure, a vibration generating module embedded into a display panel relatively requiring an expanded reproduction sound band and a high sound pressure characteristic in the low-pitched sound band may be provided apart from the second substrate as illustrated in FIG. 3.

Figure 17:
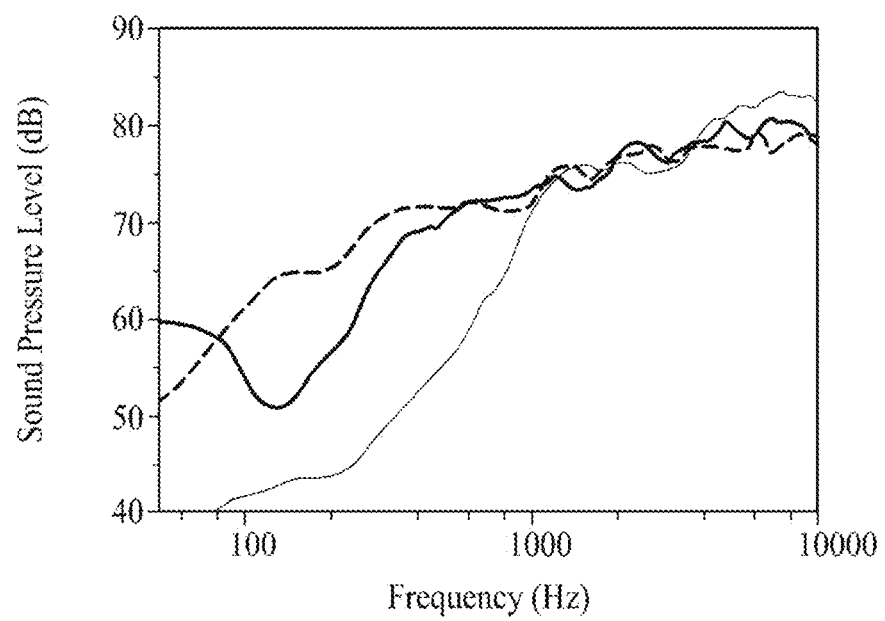
FIG. 17 is a graph showing a sound pressure characteristic based on a size of a partition surrounding a vibration generating module embedded into the display panel according to the sixth embodiment of the present disclosure.

FIG. 17 is a graph showing a sound pressure characteristic based on a size of a partition surrounding a vibration generating module embedded into the display panel according to the sixth embodiment of the present disclosure. In the sound pressure measurement of FIG. 17, Audio Precision company's APX525 has been used, a sine sweep has been applied at 50 Hz to 10 kHz, and a sound pressure has been measured at a position space apart from a display panel, a flexible vibration module, and a film speaker by 10 cm. The sine sweep may be a process of performing a sweep for a short time, but a process is not limited thereto. In FIG. 16, the abscissa axis represents a frequency (Hz), and the ordinate axis represents a sound pressure level (dB).

In a display panel (graphed as a thin solid line) based on a first experiment example, a partition surrounding a vibration generating module having a size of 3×6 cm has been provided to have a size of 4×7 cm. In a display panel (graphed as a thick solid line) based on a second experiment example, a partition surrounding a vibration generating module having a size of 3×6 cm has been provided to have a size of 5×10 cm. In a display panel (graphed as a thick dotted line) based on a third experiment example, a partition surrounding a vibration generating module having a size of 3×6 cm has been provided to have a size 6×12 cm.

As shown in FIG. 17, it may be seen that, in a state where a size of a vibration generating module is fixed, as a size of the partition increases, a sound pressure characteristic increases in a low-pitched sound band of about 1 kHz or less, and thus, a reproduction sound band of the low-pitched sound band expands. Particularly, comparing with the display panel (the thin solid line) based on the first experiment example, it may be seen that each of the display panel (the thick solid line) based on the second experiment example and the display panel (the thick dotted line) based on the third experiment example has a sound pressure level of 50 dB or more in a full audible frequency. For example, the audible frequency may be, for example, 20 Hz to 20 kHz, but a range thereof is not limited thereto.

Therefore, in the display panel according to the sixth embodiment of the present disclosure, a reproduction sound band and a sound pressure characteristic of a low-pitched sound band which are to be realized through a vibration of the display panel may be adjusted, and thus, it may be easy to realize a desired sound of the low-pitched sound band.

The display panel with the vibration generating module embedded thereinto and the display apparatus including the same according to the present disclosure may be applied to various applications. For example, the display panel with the vibration generating module embedded thereinto and the display apparatus including the same may be applied to mobile devices, video phones, smart watches, watch phones, wearable devices, foldable devices, rollable devices, bendable devices, flexible devices, curved devices, electronic organizers, electronic notebook, electronic book, portable multimedia players (PMPs), personal digital assistants (PDAs), MP3 player, mobile medical devices, desktop personal computers (PCs), laptop PCs, netbook computers, workstations, navigation devices, automotive navigation devices, automotive display apparatuses, TVs, wall paper display apparatuses, signage devices, game machines, notebook computers, monitors, cameras, camcorders, home appliances, etc. Also, in a case where the display panel with the vibration generating module embedded thereinto and the display apparatus including the same is applied to a mobile device, the display panel may act as a speaker or a receiver, but is not limited thereto.

A display panel and a display apparatus including the same according to the present disclosure will be described below.

A display panel according to an embodiment of the present disclosure includes a first substrate including a display portion configured to display an image; a second substrate attached to the first substrate by an adhesive member; and a vibration generating module within the adhesive member to overlap the display portion, the vibration generating module being surrounded by the second substrate and the adhesive member.

According to some embodiments of the present disclosure, the vibration generating module may contact the second substrate.

According to some embodiments of the present disclosure, the vibration generating module may be inserted into the adhesive member and may be separated from the second substrate by the adhesive member disposed therebetween.

According to some embodiments of the present disclosure, the vibration generating module may include a piezoelectric layer; and the piezoelectric layer may include: a plurality of piezoelectric portions; and a plurality of flexible portions between the plurality of piezoelectric portions.

According to some embodiments of the present disclosure, each piezoelectric portion may include an inorganic material, and each flexible portion may include at least one of an organic piezoelectric material and an organic non-piezoelectric material.

According to some embodiments of the present disclosure, the plurality of piezoelectric portions and the plurality of flexible portions may be disposed in parallel on a same plane.

According to some embodiments of the present disclosure, the plurality of piezoelectric portions and the plurality of flexible portions are alternately disposed; and a width of each of the plurality of piezoelectric portions is the same as or different from a width of each of the plurality of flexible portions.

A display apparatus according to an embodiment of the present disclosure includes a display substrate including a pixel layer having a plurality of pixels on a first substrate; and a cover substrate configured to cover the display substrate, wherein the cover substrate includes: a second substrate on the display substrate; a vibration generating module on the second substrate; and an adhesive member attached to the pixel layer to cover the vibration generating module.

According to some embodiments of the present disclosure, the vibration generating module may include at least three surfaces; and the adhesive member surrounds at least two surfaces of the vibration generating module.

According to some embodiments of the present disclosure, the vibration generating module may include a piezoelectric layer; and the piezoelectric layer includes: a plurality of piezoelectric portions; and a plurality of flexible portions between the plurality of piezoelectric portions.

According to some embodiments of the present disclosure, the plurality of piezoelectric portions and the plurality of flexible portions may be disposed in parallel on a same plane.

According to some embodiments of the present disclosure, the plurality of piezoelectric portions and the plurality of flexible portions may be alternately disposed; and a width of each of the plurality of piezoelectric portions may be the same as or different from a width of each of the plurality of flexible portions.

According to some embodiments of the present disclosure, the plurality of piezoelectric portions and the plurality of flexible portions may be disposed in parallel on a same plane, and a width of each of the plurality of flexible portions decreases in a direction from a center portion to an edge or a periphery of the vibration generating module.

According to some embodiments of the present disclosure, the vibration generating module may include a first vibration generating module overlapping a first region of the display substrate; and a second vibration generating module overlapping a second region of the display substrate.

According to some embodiments of the present disclosure, the display apparatus may further include a partition in the adhesive member between the first vibration generating module and the second vibration generating module.

According to some embodiments of the present disclosure, the display apparatus may further include a partition in the adhesive member to surround each of the first vibration generating module and the second vibration generating module.

A display apparatus according to an embodiment of the present disclosure includes a display panel including a first substrate including a display portion configured to display an image; a second substrate attached to the first substrate by an adhesive member; and a vibration generating module within the adhesive member to overlap the display portion, the vibration generating module being surrounded by the second substrate and the adhesive member; and a structure on a rear surface of the display panel.

According to some embodiments of the present disclosure, the adhesive member may include a first adhesive layer and a second adhesive layer.

According to some embodiments of the present disclosure, the first adhesive member may be configured to transfer a vibration of the vibration generating module to the second substrate.

According to some embodiments of the present disclosure, the first adhesive layer may have a hardness characteristic that is higher than that of the second adhesive layer.

According to some embodiments of the present disclosure, a gap space may be between the display panel and the structure; and a space division member may be between the display panel and the structure to divide the gap space into a first region and a second region.

According to some embodiments of the present disclosure, the vibration generating module may include a first vibration generating module overlapping a first region of the display substrate; and a second vibration generating module overlapping a second region of the display substrate.

According to some embodiments of the present disclosure, the display apparatus may further include a partition in the adhesive member between the first vibration generating module and the second vibration generating module.

According to some embodiments of the present disclosure, the display apparatus may further include a partition in the adhesive member to surround each of the first vibration generating module and the second vibration generating module.

According to some embodiments of the present disclosure, the display panel may be capable of being wound in a spiral form, unwound, or at a certain curvature radius; and the vibration generating module may be bent based on winding or unwinding of the display panel, or may be bent based on a curvature of the display panel.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An organic light emitting display apparatus, comprising:
   a first substrate;
   a second substrate attached to the first substrate by an adhesive member;
   a light emitting device disposed on the first substrate and including an anode electrode, a light emitting layer provided on the anode electrode, and a cathode electrode; and
   a vibration generating device disposed inside the adhesive member and including at least one inorganic material layer,
   wherein the light emitting layer is implemented to emit light of the same color for each pixel or to emit lights of different colors for different color pixels.

2. The organic light emitting display apparatus of claim 1, further comprising an encapsulation layer between the light emitting device and the second substrate,
   wherein the encapsulation layer includes at least one inorganic material layer and at least one organic material layer.

3. The organic light emitting display apparatus of claim 2, wherein the adhesive member is disposed between the second substrate and the encapsulation layer.

4. The organic light emitting display apparatus of claim 2, wherein the encapsulation layer has a multi-layer structure where the at least one organic material layer and the at least one inorganic material layer are alternately stacked.

5. The organic light emitting display apparatus of claim 4, wherein the at least one organic material layer has a greater thickness than the at least one inorganic material layer.

6. The organic light emitting display apparatus of claim 4, wherein the at least one inorganic material layer includes at least one of silicon nitride (SiNx), silicon oxide (SiOx), silicon oxynitride (SiON), and aluminum oxide (AlxOy).

7. The organic light emitting display apparatus of claim 4, wherein the at least one organic material layer includes at least one of acryl resin, epoxy resin, phenolic resin, polyamide resin, polyimide resin, benzocyclobutene resin, and fluoride resin.

8. The organic light emitting display apparatus of claim 4, wherein the encapsulation layer includes a first inorganic material layer surrounding the light emitting device.

9. The organic light emitting display apparatus of claim 1, further comprising a sealing member disposed between the first substrate and the second substrate,
   wherein the sealing member supports at least one of the first substrate and the second substrate.

10. The organic light emitting display apparatus of claim 9, wherein the adhesive member contacts at least one side surface of the sealing member.

11. The organic light emitting display apparatus of claim 9, wherein the sealing member includes a high-viscosity resin cured by light and an epoxy material including a getter material capable of adsorbing water or oxygen.

12. The organic light emitting display apparatus of claim 1, further comprising a functional film disposed on either one of the first substrate and the second substrate.

13. The organic light emitting display apparatus of claim 12, wherein the functional film is disposed in a direction in which light is emitted.

14. The vibration apparatus of claim 1, wherein the light emitting layer is an organic light emitting layer.

15. The organic light emitting display apparatus of claim 1, wherein the light emitting layer has a stacked structure of an organic light emitting layer.

16. The organic light emitting display apparatus of claim 1, wherein the first substrate includes a glass material.

17. The organic light emitting display apparatus of claim 1, wherein the second substrate includes a metal.

18. The organic light emitting display apparatus of claim 1, further comprising a filler disposed between the first substrate and the second substrate,
wherein the filler includes a transparent epoxy material which transmits light.

19. The organic light emitting display apparatus of claim 1, further comprising a pixel circuit layer disposed on the first substrate,
wherein the pixel circuit layer includes:
a plurality of signal lines disposed on the first substrate; and
a pixel circuit disposed in each of a plurality of pixel areas defined by the signal lines,
wherein the signal lines include a gate line, a data line, and a pixel driving power line, and
wherein the pixel circuit includes a plurality of thin film transistors connected respectively to the signal lines and at least one capacitor.

20. The organic light emitting display apparatus of claim 1, wherein the vibration generating device is accommodated into the adhesive member and is separated from the second substrate by the adhesive member disposed therebetween.

21. The organic light emitting display apparatus of claim 20, wherein the adhesive member includes:
a first adhesive layer disposed between the second substrate and the vibration generating device; and
a second adhesive layer disposed on the first adhesive layer to cover an entire portion of the vibration generating device.

22. The organic light emitting display apparatus of claim 21, wherein the first adhesive layer is configured to transfer a vibration of the vibration generating device to the second substrate.

23. The organic light emitting display apparatus of claim 1, wherein:
the vibration generating device includes a piezoelectric layer; and
the piezoelectric layer includes:
a plurality of piezoelectric portions; and
a plurality of flexible portions between the plurality of piezoelectric portions.

24. The organic light emitting display apparatus of claim 23, wherein each of the piezoelectric portions includes an inorganic material, and each of the flexible portions includes at least one of an organic piezoelectric material and an organic non-piezoelectric material.

25. The organic light emitting display apparatus of claim 23, wherein the plurality of piezoelectric portions and the plurality of flexible portions are disposed in parallel on a same plane.

26. The organic light emitting display apparatus of claim 23, wherein the plurality of piezoelectric portions and the plurality of flexible portions are alternately disposed, and wherein a width of each of the plurality of piezoelectric portions is the same as or different from a width of each of the plurality of flexible portions.

27. The organic light emitting display apparatus of claim 26, wherein the width of each of the plurality of flexible portions disposed between the plurality of piezoelectric portions progressively decreases in a direction from a center portion to both edges of the vibration generating device.

28. The organic light emitting display apparatus of claim 1, wherein the vibration generating device comprises:
a first vibration generating device overlapping a first region of the first substrate; and
a second vibration generating device overlapping a second region of the first substrate.

29. The organic light emitting display apparatus of claim 28, further comprising a partition at the adhesive member between the first vibration generating device and the second vibration generating device.

30. The organic light emitting display apparatus of claim 28, further comprising a partition at the adhesive member to surround each of the first vibration generating device and the second vibration generating device.

31. The organic light emitting display apparatus of claim 1, further comprising a rear structure at the second substrate.

32. The organic light emitting display apparatus of claim 31, further comprising:
a gap space between the second substrate and the rear structure; and
a space division member between the second substrate and the rear structure to divide the gap space into a first region and a second region.

33. The organic light emitting display apparatus of claim 32, wherein:
the vibration generating device includes a first vibration generating device and a second vibration generating device;
the first vibration generating device is at the first region; and
the second vibration generating device is at the second region.

34. The organic light emitting display apparatus of claim 31, further comprising:
a supporting part between a rear periphery of the second substrate and a front periphery of the rear structure; and
a sidewall portion configured to surround an outer surface of the second substrate and an outer surface of the rear structure.

35. The organic light emitting display apparatus of claim 1, wherein the light emitting layer is a quantum dot light emitting layer.

36. The organic light emitting display apparatus of claim 1, wherein the adhesive member contacts at least one lateral surface and at least one of upper and lower surfaces of the vibration generating device.

37. The organic light emitting display apparatus of claim 1, wherein, in a plan view, the adhesive member overlaps the vibration generating device entirely and has a larger area than the vibration generating device.

* * * * *